(12) United States Patent
An et al.

(10) Patent No.: US 12,232,286 B2
(45) Date of Patent: Feb. 18, 2025

(54) DISPLAY MODULE INCLUDING CUSHION LAYER AND ELECTRONIC DEVICE INCLUDING DISPLAY MODULE

(71) Applicant: SAMSUNG ELECTRONICS CO., LTD., Suwon-si (KR)

(72) Inventors: Jungchul An, Suwon-si (KR); Seonghoon Kim, Suwon-si (KR); Hyunsuk Jung, Suwon-si (KR); Soyoung Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/096,225

(22) Filed: Jan. 12, 2023

(65) Prior Publication Data

US 2023/0180413 A1 Jun. 8, 2023

Related U.S. Application Data

(63) Continuation of application No. PCT/KR2022/019899, filed on Dec. 8, 2022.

(30) Foreign Application Priority Data

Dec. 8, 2021 (KR) .......................... 10-2021-0175110

(51) Int. Cl.
*H05K 5/03* (2006.01)
*G06F 1/16* (2006.01)
(Continued)

(52) U.S. Cl.
CPC ............. *H05K 5/03* (2013.01); *G06F 1/1643* (2013.01); *G06F 1/1652* (2013.01);
(Continued)

(58) Field of Classification Search
None
See application file for complete search history.

(56) References Cited

U.S. PATENT DOCUMENTS

| 10,310,566 B2 | 6/2019 | Liao et al. |
| 11,048,302 B2 | 6/2021 | Seo |

(Continued)

FOREIGN PATENT DOCUMENTS

| EP | 3737074 | | 11/2020 |
| KR | 20150099383 A | * | 4/2017 |

(Continued)

OTHER PUBLICATIONS

Search Report and Written Opinion dated Mar. 16, 2023 issued in International Patent Application No. PCT/KR2022/019899.

(Continued)

*Primary Examiner* — Kirk W Hermann
(74) *Attorney, Agent, or Firm* — NIXON & VANDERHYE P.C.

(57) ABSTRACT

A device includes: a first housing, a second housing rotatably connected to the first housing, a display panel, a partial area of which is deformed by rotation of the second housing with respect to the first housing, a support plate disposed on the rear surface of the display panel and having a first area corresponding to the deformable area of the display panel and including openings formed at specified intervals, and a second area excluding the first area, a cushion layer disposed on the rear surface of the support plate at a position corresponding to the second area and including an impact absorbing material, a blocking member comprising flexible material disposed on the rear surface of the support plate and configured to be elongated according to deformation of the display panel, and a reinforcing plate disposed under the cushion layer and the blocking member.

20 Claims, 16 Drawing Sheets

(51) Int. Cl.
  *G06F 3/041* (2006.01)
  *H05K 5/02* (2006.01)
(52) U.S. Cl.
  CPC ............ *G06F 1/1656* (2013.01); *G06F 3/041* (2013.01); *H05K 5/0226* (2013.01)

(56) References Cited

U.S. PATENT DOCUMENTS

| | | | |
|---|---|---|---|
| 11,314,284 B2 | 4/2022 | Kim et al. | |
| 11,432,410 B2 | 8/2022 | Woo et al. | |
| 2015/0241925 A1* | 8/2015 | Seo | G06F 1/1652 361/679.27 |
| 2017/0153668 A1* | 6/2017 | Jang | G06F 1/1641 |
| 2018/0024593 A1* | 1/2018 | Seo | G06F 1/1681 361/679.21 |
| 2019/0005857 A1 | 1/2019 | Wakata | |
| 2019/0166703 A1 | 5/2019 | Kim et al. | |
| 2019/0334114 A1* | 10/2019 | Park | H05K 5/0226 |
| 2020/0209998 A1* | 7/2020 | Shin | G06F 3/044 |
| 2020/0319672 A1 | 10/2020 | Kim et al. | |
| 2021/0104693 A1 | 4/2021 | Cho et al. | |
| 2021/0126223 A1 | 4/2021 | Choi et al. | |
| 2021/0141124 A1 | 5/2021 | Park et al. | |
| 2021/0217976 A1 | 7/2021 | Min | |
| 2021/0249625 A1 | 8/2021 | Kim et al. | |
| 2021/0373604 A1 | 12/2021 | Shin et al. | |

FOREIGN PATENT DOCUMENTS

| | | | |
|---|---|---|---|
| KR | 10-2019-0137433 | | 12/2019 |
| KR | 10-2063283 | | 1/2020 |
| KR | 10-2020-0067804 | | 6/2020 |
| KR | 20200108754 A | * | 9/2020 |
| KR | 10-2021-0041664 | | 4/2021 |
| KR | 10-2021-0049326 | | 5/2021 |
| KR | 10-2021-0056484 | | 5/2021 |
| KR | 10-2021-0070880 | | 6/2021 |
| KR | 10-2021-0091388 | | 7/2021 |
| KR | 10-2021-0146482 | | 12/2021 |

OTHER PUBLICATIONS

Extended European Search Report for EP Application No. 22904682.6 dated Nov. 27, 2024, 10 pages.

* cited by examiner

DISPLAY MODULE INCLUDING CUSHION LAYER AND ELECTRONIC DEVICE INCLUDING DISPLAY MODULE

CROSS-REFERENCE TO RELATED APPLICATIONS

This application is a continuation of International Application No. PCT/KR2022/019899 designating the United States, filed on Dec. 8, 2022, in the Korean Intellectual Property Receiving Office and claiming priority to Korean Patent Application No. 10-2021-0175110, filed on Dec. 8, 2021, in the Korean Intellectual Property Office, the disclosures of which are incorporated by reference herein in their entireties.

BACKGROUND

Field

The disclosure relates to a display module including a cushion layer and an electronic device including a display module.

Description of Related Art

As more information is visually displayed and electronic devices support more functions, the number of users who want a larger screen display is increasing. A new type of electronic device is being developed to provide a large-screen display while maintaining an easily portable size.

With the development of display technology, it has become possible to realize a foldable display. An electronic device, in which an area for displaying information is variable by folding using such a display, has also been released.

The display may include various elements for protecting the display from external impact.

A window may be disposed on the front surface of a display to protect the display. The window may be formed of, for example, a material such as glass. On the front surface of a foldable display, disposing a window is restricted, or a window made very thin may be disposed. Therefore, the foldable display may be more vulnerable to impact applied from the front.

When a member for cushioning external impact is disposed on the rear surface of a panel included in a display, the panel may be moved by impact applied from the front, thereby causing a defect in the display. For this reason, a structure in which the cushioning member is disposed in a different position without being attached to the rear surface of the panel may be used. However, as the number of elements included in the display increases, the area for disposing the cushioning member may be reduced.

SUMMARY

Embodiments of the disclosure may provide a structure in which a cushion layer, which is a member capable of cushioning an external force applied to a display, can be disposed in a larger area.

An electronic device according to various example embodiments disclosed herein may include: a first housing, a second housing rotatably connected to the first housing, a display panel, a partial area of which is configured to be deformed by rotation of the second housing with respect to the first housing, a support plate disposed on the rear surface of the display panel supporting the display panel, the support plate including a first area corresponding to a deformable area of the display panel and including multiple openings formed at specified intervals, and a second area excluding the first area, a cushion layer disposed on the rear surface of the support plate at a position corresponding to the second area and including a material capable of absorbing external impact, a foreign material blocking member comprising a flexible material disposed on the rear surface of the support plate at a position corresponding to the first area and including a flexible material and elongated according to the deformation of the display panel, and a reinforcing plate disposed under the cushion layer and the foreign material blocking member.

A display module according to various example embodiments disclosed herein may include: a display panel, a partial area of which is configured to be deformable, a support plate disposed on the rear surface of the display panel supporting the display panel, the support plate including a first area corresponding to a deformable area of the display panel and including multiple openings formed at specified intervals, and a second area excluding the first area, a cushion layer disposed on the rear surface of the support plate at a position corresponding to the second area and including a material capable of absorbing external impact, a foreign material blocking member comprising a flexible material disposed on the rear surface of the support plate at a position corresponding to the first area and including a flexible material configured to be elongated according to the deformation of the display panel, and a reinforcing plate disposed under the cushion layer and the foreign material blocking member.

According to various example embodiments disclosed herein, a member capable of cushioning an impact applied to the display may be applied to a larger area, and thus the durability of the display may be improved.

BRIEF DESCRIPTION OF THE DRAWINGS

In describing the drawings, identical or similar reference numerals may be used to denote identical or similar elements. Further, the above and other aspects, features and advantages of certain embodiments of the present disclosure will be more apparent from the following detailed description, taken in conjunction with the accompanying drawings, in which.

DETAILED DESCRIPTION

Figure 1A:
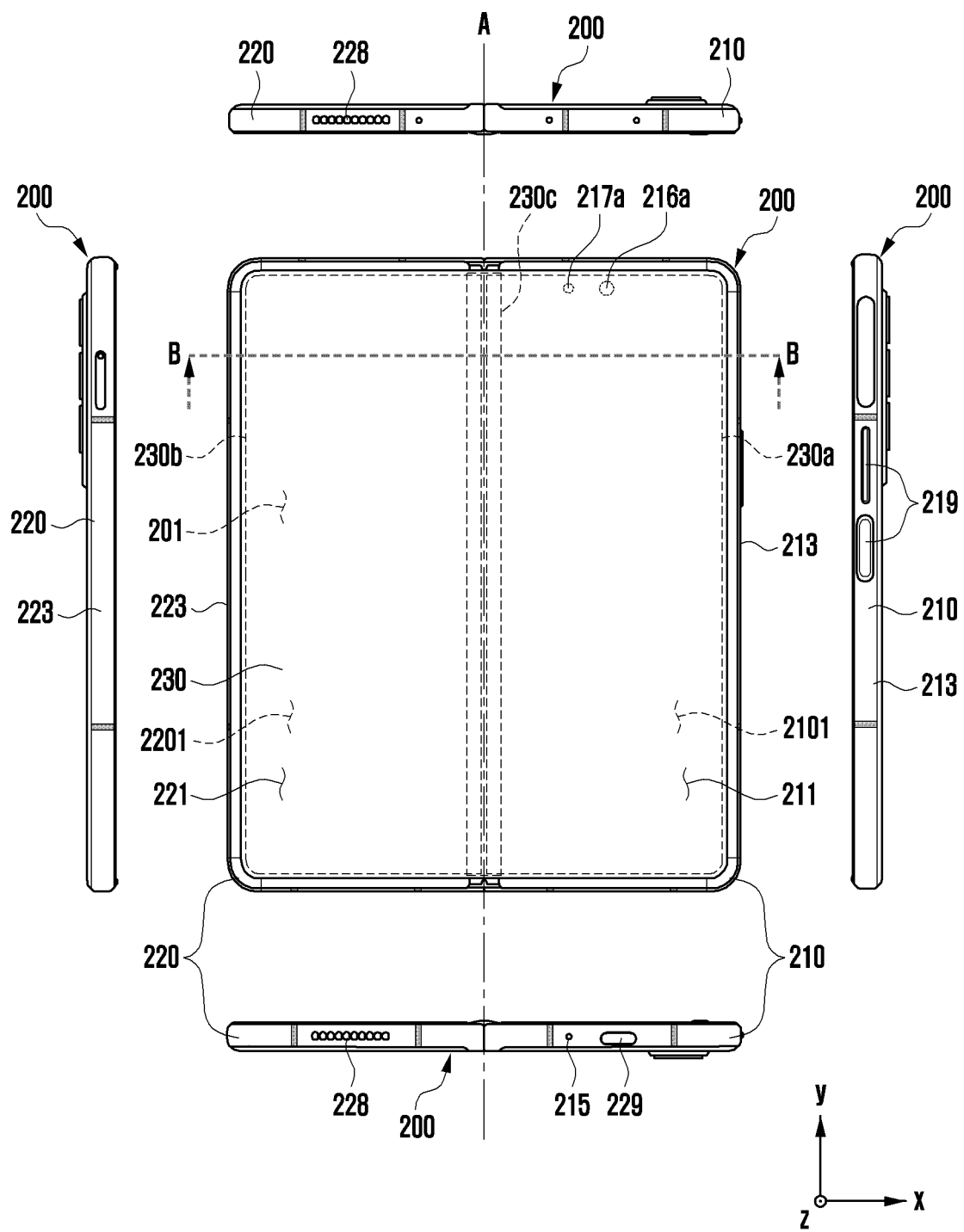
FIGS. 1A and 1B are diagrams illustrating front and rear views of an electronic device in an unfolded state according to various embodiments.
Figure 1B:
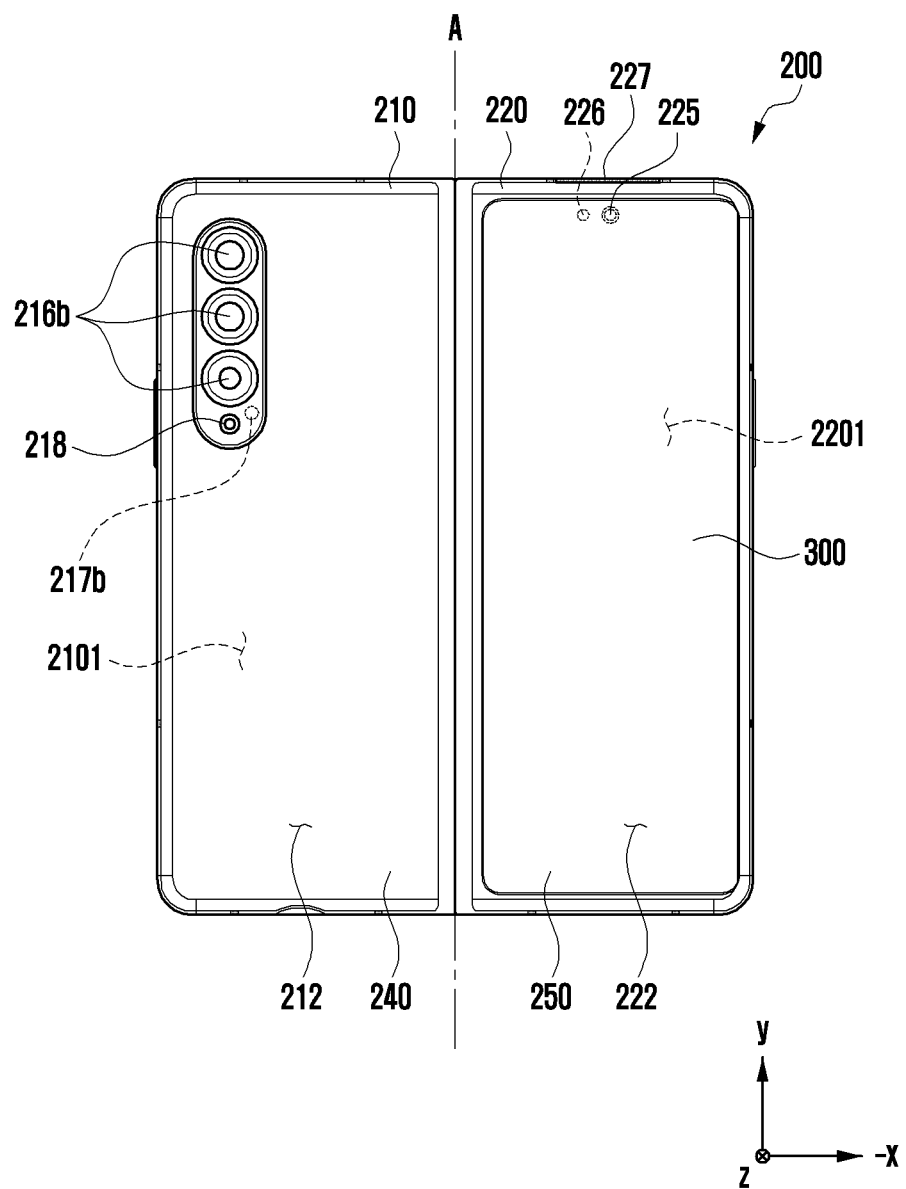
Figure 2A:
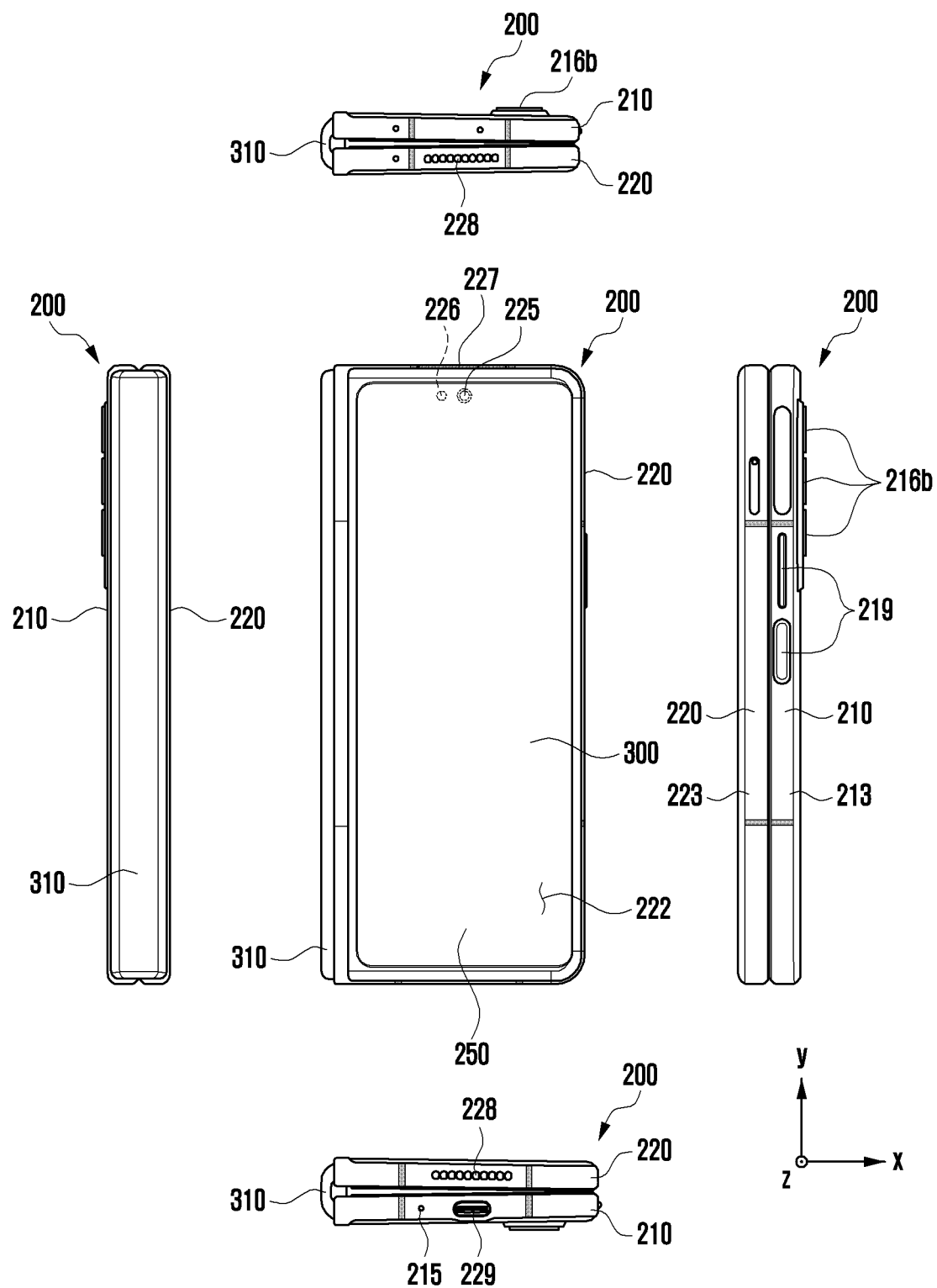
FIGS. 2A and 2B are diagrams illustrating front and rear views of an electronic device in a folded state according to various embodiments.
Figure 2B:
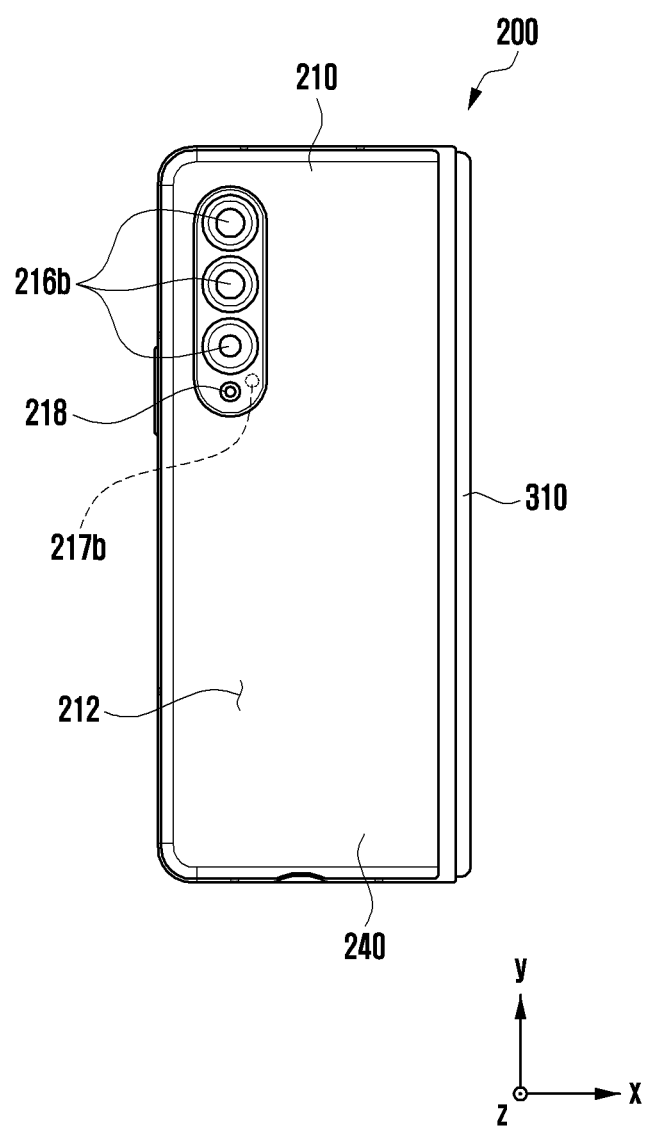

FIGS. 1A and 1B are diagrams illustrating front and rear views of an electronic device in an unfolded state according to various embodiments. FIGS. 2A and 2B are diagrams illustrating front and rear views of an electronic device in a folded state according to various embodiments.

Referring to FIGS. 1A, 1B, 2A and 2B (which may be referred to as FIGS. 1A to 2B), an electronic device 200 may include a pair of housings 210 and 220 coupled to be rotatable about a folding axis A through a hinge device (e.g., the hinge device 320 in FIG. 3) (e.g., a hinge module) so as to be foldable with respect to each other (e.g., a foldable housing structure), a first display 230 (e.g., a flexible display, a foldable display, or a main display) disposed through the pair of housings 210 and 220, and/or a second display 300 (e.g., a sub-display) through the second housing 220. According to an embodiment, at least a portion of the hinge device (e.g., the hinge device 320 in FIG. 3) may be disposed so as not to be seen from the outside through the first housing 210 and the second housing 220, and may be disposed so as not to be seen from the outside through a hinge housing 310 covering a foldable portion in an unfolded state. Herein, a surface on which the first display 230 is disposed may be defined as the front surface of the electronic device 200, and a surface opposite of the front surface may be defined as the rear surface of the electronic device 200. Furthermore, a surface surrounding the space between the front surface and the rear surface may be defined as the side surface of the electronic device 200.

Figure 3:
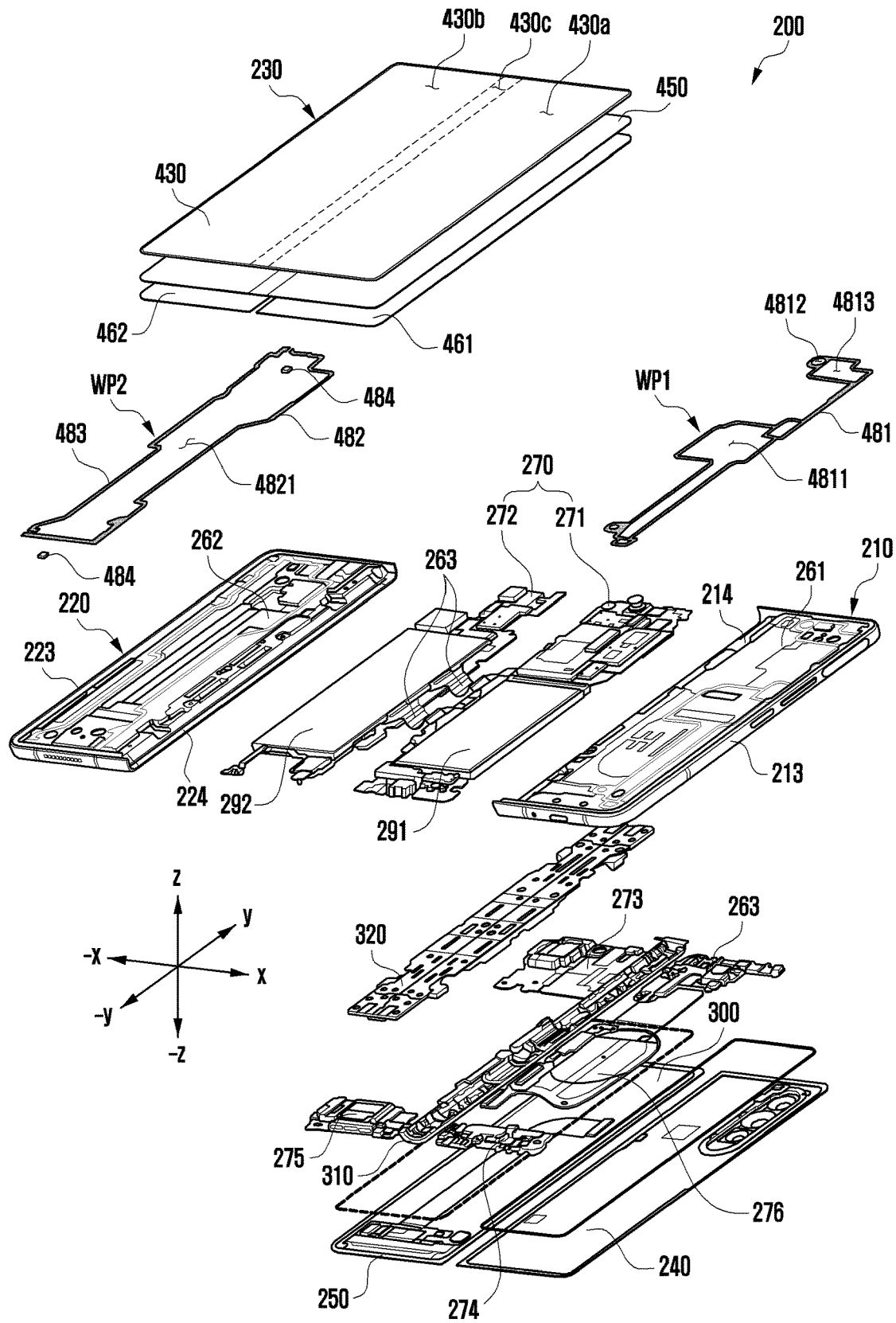
FIG. 3 is an exploded perspective view of an electronic device according to various embodiments.

According to various embodiments, the pair of housings 210 and 220 may include the first housing 210 and the second housing 220 which are arranged to be foldable with respect to each other through the hinge device (e.g., the hinge device 320 in FIG. 3). According to an embodiment, the pair of housings 210 and 220 are not limited to the form and combination illustrated in FIGS. 1A to 2B, and may be implemented by a combination and/or coupling of other shapes or components. According to an embodiment, the first housing 210 and the second housing 220 may be disposed on both sides with reference to the folding axis A, and may have overall symmetrical shapes with respect to the folding axis A. According to an embodiment, the first housing 210 and the second housing 220 may be folded asymmetrically about the folding axis A. According to an embodiment, an angle or a distance formed between the first housing 210 and the second housing 220 may vary depending on whether the electronic device 200 is in unfolded stage, a folded state, or an intermediate state.

According to various embodiments, the first housing 210 may include a first surface 211 connected to the hinge device (e.g., the hinge device 320 in FIG. 3) in the unfolded state of the electronic device 200 and disposed to face the front surface of the electronic device 200, a second surface 212 facing a direction opposite to a direction faced by the first surface 211, and/or a first side member 213 surrounding at least a portion of a first space between the first surface 211 and the second surface 212. According to an embodiment, the second housing 220 may include a third surface 221 connected to the hinge device (e.g., the hinge device 320 in FIG. 3) in the unfolded state of the electronic device 200 and disposed to face the front surface of the electronic device 200, a fourth surface 222 facing a direction opposite to a direction faced by the third surface 221, and/or a second side member 223 surrounding at least a portion of a second space between the third surface 221 and the fourth surface 222. According to an embodiment, the first surface 211 may face substantially the same direction as the third surface 221 in the unfolded state, and may at least partially face the third surface 221 in the folded state. According to an embodiment, the electronic device 200 may include a recess 201 formed to receive the first display 230 through structural coupling of the first housing 210 and the second housing 220. According to an embodiment, the recess 201 may have substantially the same size as the first display 230.

According to various embodiments, the hinge housing 310 (e.g., a hinge cover) may be disposed between the first housing 210 and the second housing 220, and may be disposed to cover a portion (e.g., at least one hinge module) of the hinge device (e.g., the hinge device 320 in FIG. 3) disposed in the hinge housing 310. According to an embodiment, the hinge housing 310 may be covered by a portion of the first housing 210 and the second housing 220 or exposed to the outside depending on the unfolded state, the folded state, or the intermediate state of the electronic device 200. For example, when the electronic device 200 is in the folded state, at least a portion of the hinge housing 310 may be covered by the first housing 210 and the second housing 220, and thus may not be substantially exposed. According to an embodiment, when the electronic device 200 is in the folded state, at least a portion of the hinge housing 310 may be exposed to the outside between the first housing 210 and the second housing 220. According to an embodiment, in the case of the intermediate state in which the first housing 210 and the second housing 220 are folded with a certain angle, the hinge housing 310 may be at least partially exposed to the outside of the electronic device 200 between the first housing 210 and the second housing 220. For example, an area of the hinge housing 310 exposed to the outside may be smaller than in a fully folded state. According to an embodiment, the hinge housing 310 may include a curved surface.

According to various embodiments, when the electronic device 200 is in an unfolded state (e.g., the state in FIGS. 1A and 1B), the first housing 210 and the second housing 220 may form an angle of about 180 degrees, and a first area 230a, a second area 230b, and a folding area 230c of the first display 230 may be disposed to form the same plane and face substantially the same direction (e.g., the z-axis direction). In an embodiment, when the electronic device 200 is in an unfolded state, the first housing 210 may rotate about an angle 360 degrees with respect to the second housing 220 to be reversely folded such that the second surface 212 faces the fourth surface 222 (an out-folding method).

According to various embodiments, when the electronic device 200 is in a folded state (e.g., the state in FIGS. 2A and 2B), the first surface 211 of the first housing 210 and the third surface 221 of the second housing 220 may be arranged to face each other. In this case, the first area 230a and the second area 230b of the first display 230 may form a narrow angle (e.g., in the range of 0 degrees to about 10 degrees)

with each other through the folding area 230c, and may be arranged to face each other. According to an embodiment, at least a portion of the folding area 230c may be deformed into a curved shape having a predetermined curvature. According to an embodiment, when the electronic device 200 is in an intermediate state, the first housing 210 and the second housing 220 may be arranged with a certain angle between each other. In this case, the first area 230a and the second area 230b of the first display 230 may form an angle larger than that of the folded state and smaller than that of the unfolded state, and the curvature of the folding area 230c may be smaller than that of the folded state and larger than that of the unfolded state. In an embodiment, the first housing 210 and the second housing 220 may form, through the hinge device (e.g., the hinge device 320 in FIG. 3), an angle that can be stopped at a designated angle between the folded state and the unfolded state (a free stop function). In an embodiment, the first housing 210 and the second housing 220 may be continuously operated while being pressed in the unfolding direction or folding direction with reference to a designated inflection angle through the hinge device (e.g., the hinge device 320 in FIG. 3).

According to various embodiments, the electronic device 200 may include at least one among at least one display 230 or 300, an input device 215, sound output devices 227 and 228, sensor modules 217a, 217b, and 226, camera modules 216a, 216b, and 225, key input devices 219, an indicator (not shown), or a connector port 229, disposed in the first housing 210 and/or the second housing 220. In an embodiment, in the electronic device 200, at least one of the elements may be omitted, or at least one other element may be additionally included.

According to various embodiments, the at least one display 230 or 300 may include the first display 230 (e.g., a flexible display) disposed to be supported by the first surface 211 of the first housing 210, the hinge device (e.g., the hinge device 320 in FIG. 3), and the third surface 221 of the second housing 220, and the second display 300 disposed in the inner space of the second housing 220 so as to be at least partially visible from the outside through the fourth surface 222. In an embodiment, the second display 300 may be disposed in the inner space of the first housing 210 so as to be visible from the outside through the second surface 212. According to an embodiment, the first display 230 may be mainly used when the electronic device 200 is in the unfolded state, and the second display 300 may be mainly used when the electronic device 200 is in the folded state. According to an embodiment, in the intermediate state, the electronic device 200 may control, based on the folding angle of the first housing 210 and the second housing 220, the first display 230 and/or the second display 300 to be usable.

According to various embodiments, the first display 230 may be disposed in a receiving space formed by the pair of housings 210 and 220. For example, the first display 230 may be disposed in the recess 201 formed by the pair of housings 210 and 220, and may be disposed to occupy, in the unfolded state, substantially most of the front surface of the electronic device 200. According to an embodiment, the first display 230 may include a flexible display in which at least a partial area can be deformed into a flat or curved surface. According to an embodiment, the first display 230 may include the first area 230a facing the first housing 210, the second area 230b facing the second housing 220, and the folding area 230c connecting the first area 230a to the second area 230b and facing the hinge device (e.g., the hinge device 320 in FIG. 3). According to an embodiment, the division of the area of the first display 230 is merely an example physical division by the pair of housings 210 and 220 and the hinge device (e.g., the hinge device 320 in FIG. 3), and substantially, the first display 230 may be displayed as one seamless full screen through the pair of housings 210 and 220 and the hinge device (e.g., the hinge device 320 in FIG. 3). According to an embodiment, the first area 230a and the second area 230b may have overall symmetrical shapes or partially asymmetrical shapes with reference to the folding area 230c.

According to various embodiments, the electronic device 200 may include a first rear cover 240 disposed on the second surface 212 of the first housing 210 and a second rear cover 250 on the fourth surface 222 of the second housing 220. In an embodiment, at least a portion of the first rear cover 240 may be formed integrally with the first side member 213. In an embodiment, at least a portion of the second rear cover 250 may be formed integrally with the second side member 223. According to an embodiment, at least one of the first rear cover 240 and the second rear cover 250 may be formed of a substantially transparent plate (e.g., a polymer plate or a glass plate including various coating layers) or an opaque plate. According to an embodiment, the first rear cover 240 may be formed of an opaque plate, such as coated or colored glass, ceramic, polymer, metal (e.g., aluminum, stainless steel (STS), or magnesium), or a combination of at least two of the above-mentioned materials. According to an embodiment, the second rear cover 250 may be formed through a substantially transparent plate, such as glass or polymer. Therefore, the second display 300 may be disposed in the inner space of the second housing 220 so as to be visible from the outside through the second rear cover 250.

According to various embodiments, the input device 215 may include a microphone. In an embodiment, the input device 215 may include multiple microphones disposed to sense the direction of sound. According to an embodiment, the sound output devices 227 and 228 may include speakers. According to an embodiment, the sound output devices 227 and 228 may include a call receiver 227, disposed through the fourth surface 222 of the second housing 220, and an external speaker 228, disposed through at least a portion of the second side member 223 of the second housing 220. In an embodiment, the input device 215, the sound output devices 227 and 228, and the connector port 229 may be arranged in spaces of the first housing 210 and/or the second housing 220, and may be exposed to the external environment through at least one hole formed in the first housing 210 and/or the second housing 220. In an embodiment, the holes formed in the first housing 210 and/or the second housing 220 may be used in common for the input device 215 and the sound output devices 227 and 228. In an embodiment, the sound output devices 227 and 228 may include a speaker (e.g., a piezo speaker) operating without any hole formed in the first housing 210 and/or the second housing 220.

According to various embodiments, camera modules 216a, 216b, and 225 may include a first camera module 216a disposed in the first surface 211 of the first housing 210, a second camera module 216b disposed on the second surface 212 of the first housing 210, and/or a third camera module 225 disposed in the fourth surface 222 of the second housing 220. According to an embodiment, the electronic device 200 may include a flash 218 disposed near the second camera module 216b. According to an embodiment, the flash 218 may include, for example, a light-emitting diode or a xenon lamp. According to an embodiment, the camera modules 216a, 216b, and 225 may include one or multiple lenses, an image sensor, and/or an image signal processor. In an embodiment, at least one camera module of the camera modules 216a, 216b, and 225 may include two or more lenses (e.g., wide-angle and telephoto lenses) and image sensors, and may be disposed together on any one surface of the first housing 210 and/or the second housing 220.

According to various embodiments, sensor modules 217a, 217b, and 226 may generate an electrical signal or data value corresponding to an operation state inside the electronic device 200 or an environmental state outside the electronic device 200. According to an embodiment, sensor modules 217a, 217b, and 226 may include a first sensor module 217a disposed in the first surface 211 of the first housing 210, a second sensor module 217b disposed in the second surface 212 of the first housing 210, and/or a third sensor module 226 disposed in the fourth surface 222 of the second housing 220. In an embodiment, sensor modules 217a, 217b, and 226 may include at least one among a gesture sensor, a grip sensor, a color sensor, an infrared (IR) sensor, an illuminance sensor, an ultrasonic sensor, an iris recognition sensor, or a distance detection sensor (e.g., a time-of-flight (TOF) sensor or light detection and ranging (LiDAR)).

According to various embodiments, the electronic device 200 may further include at least one of sensor modules, which are not shown, for example, a barometric pressure sensor, a magnetic sensor, a biosensor, a temperature sensor, a humidity sensor, or a fingerprint recognition sensor. In an embodiment, the fingerprint recognition sensor may be disposed through at least one side member among the first side member 213 of the first housing 210 and/or the second side member 223 of the second housing 220.

According to various embodiments, the key input devices 219 may be disposed to be exposed to the outside through the first side member 213 of the first housing 210. In an embodiment, the key input devices 219 may be disposed to be exposed to the outside through the second side member 223 of the second housing 220. In an embodiment, the electronic device 200 may not include some or all of the key input devices 219, and the key input devices 219, which are not included in the electronic device 200 may be implemented in another form, such as a soft key, on the at least one display 230 or 300. In an embodiment, the key input devices 219 may be implemented using a pressure sensor included in the at least one display 230 or 300.

According to various embodiments, the connector port 229 may include a connector (e.g., a USB connector or an IF module (an interface connector port module)) or transmitting and receiving power and/or data to and from an external electronic device. In an embodiment, the connector port 229 may further include a separate connector port (e.g., an ear jack hole) for performing a function of transmitting or receiving an audio signal to or from an external electronic device together therewith or performing a function of an audio signal transmission/reception function.

According to various embodiments, at least one camera module 216a or 225 among the camera modules 216a, 216b, and 225, at least one sensor module 217a or 226 among the sensor modules 217a, 217b, and 226, and/or the indicator may be arranged to be exposed through the at least one display 230 or 300. For example, the at least one sensor module 216a or 225, the at least one sensor module 217a or 226, and/or the indicator may be arranged under a display area of the at least one display 230 or 300 in the inner space of the at least one housing 210 or 220, and may be arranged to be in contact with the external environment through a transparent area or an opening formed up to a cover member (e.g., a window layer (not shown) of the first display 230 and/or the second rear cover 250). According to an embodiment, an area in which an area the at least one display 230 or 300 faces the at least one camera module 216a or 225 is a portion of an area for displaying a content, and may be formed a transmissive area having a predetermined transmittance. According to an embodiment, the transmissive area may be formed to have a transmittance in a range of about 5% to about 20%. The transmission area may include an area overlapping an effective area (e.g., a field-of-view area) of at least one camera module 216a or 225 through which light for generating an image by being imaged by an image sensor passes. For example, the transmissive area of each of the displays 230 and 300 may include an area having a lower pixel density than the surrounding area. For example, the transmissive area may replace the opening. For example, the at least one camera module 216a or 225 may include an under-display camera (UDC) or an under-panel camera (UPC). In an embodiment, some camera modules or sensor modules 217a and 226 may be arranged to perform functions thereof without being visually exposed through the displays. For example, areas facing the camera modules 216a and 225 and/or the sensor modules 217a and 226 disposed under the displays 230 and 300 (e.g., display panels) may be under-display camera (UDC) structures, and thus a perforated opening may be unnecessary.

FIG. 3 is an exploded perspective view of the electronic device 200 according to various embodiments.

Referring to FIG. 3, the electronic device 200 may include the first display 230 (e.g., a flexible display), the second display 300, a hinge device 320, a pair of support members 261 and 262, at least one substrate 270 (e.g., a printed circuit board (PCB)), the first housing 210, the second housing 220, the first rear cover 240, and/or the second rear cover 250.

According to various embodiments, the first display 230 may include a display panel 430 (e.g., a flexible display panel), a support plate 450 disposed under the display panel 430, and a pair of reinforcing plates 461 and 462 disposed under the support plate 450. According to an embodiment, the display panel 430 may include a first panel area 430a corresponding to the first area (e.g., the first area 230a in FIG. 1A) of the first display 230, a second panel area 430b extending from the first panel area 430a and corresponding to the second area (e.g., the second area 230b in FIG. 1A) of the first display 230, and a third panel area 430c connecting the first panel area 430a to the second panel area 430b and corresponding to the folding area (e.g., the folding area 230c in FIG. 1A) of the first display 230. According to an embodiment, the support plate 450 may be disposed between the display panel 430 and the pair of support members 261 and 262, and may be formed to have a material and a shape for providing a planar support structure for the first panel area 430a and the second panel area 430b and providing a bendable structure to aid in the flexibility of the third panel area 430c. According to an embodiment, the support plate 450 may be formed of a conductive material (e.g., metal) or a non-conductive material (e.g., polymer or fiber reinforced plastics (FRP)). According to an embodiment, the pair of reinforcing plates 461 and 462 may include a first reinforcing plate 461 disposed to correspond to at least the first panel area 430a and a portion of the third panel area 430c between the support plate 450 and the pair of support members 261 and 262, and a second reinforcing plate 462 disposed to correspond to the second panel area 430b and at least a portion of the third panel area 430c. According to an embodiment, the pair of reinforcing plates 461 and 462 may be formed of a metal material (e.g., SUS), and may thus aid in reinforcing a ground connection structure and rigidity for the first display 230.

According to various embodiments, the second display 300 may be disposed in the space between the second housing 220 and the second rear cover 250. According to an embodiment, the second display 300 may be disposed in the space between the second housing 220 and the second rear cover 250 so as to be visible from the outside through the substantially entire area of the second rear cover 250.

According to various embodiments, at least a portion of a first support member 261 may be foldably coupled to a second support member 262 through the hinge device 320. According to an embodiment, the electronic device 200 may include at least one wiring member 263 (e.g., a flexible printed circuit board (FPCB)) disposed across the hinge device 320 from at least a portion of the first support member 261 to a portion of the second support member 262. According to an embodiment, the first support member 261 may extend from the first side member 213, or may be disposed to be structurally coupled to the first side member 213. According to an embodiment, the electronic device 200 may include a first space (e.g., the first space 2101 in FIG. 1A) provided through the first support member 261 and the first rear cover 240. According to an embodiment, the first housing 210 (e.g., a first housing structure) may be configured through the combination of the first side member 213, the first support member 261, and the first rear cover 240. According to an embodiment, the second support member 262 may extend from the second side member 223, or may be disposed to be structurally coupled to the second side member 223. According to an embodiment, the electronic device 200 may include a second space (e.g., the second space 2201 in FIG. 1A) provided through the second support member 262 and the second rear cover 250. According to an embodiment, the second housing 220 (e.g., a second housing structure) may be configured through the combination of the second side member 223, the second support member 262, and the second rear cover 250. According to an embodiment, at least portions of the at least one wiring member 263 and/or the hinge device 320 may be disposed to be supported by at least portions of the pair of support members 261 and 262. According to an embodiment, the at least one wiring member 263 may be disposed in a direction in which the at least one wiring member 263 traverses the first support member 261 and the second support member 262 (e.g., the x-axis direction). According to an embodiment, the at least one wiring member 263 may be disposed in a direction (e.g., the x-axis direction) substantially perpendicular to a folding axis (e.g., the y-axis or the folding axis A in FIG. 1A).

According to various embodiments, the at least one substrate 270 may include to first substrate 271 disposed in the first space 2101 and a second substrate 272 disposed in the second space 2201. According to an embodiment, the first substrate 271 and the second substrate 272 may include multiple electronic components arranged to implement various functions of the electronic device 20. According to an embodiment, the first substrate 271 and the second substrate 272 may be electrically connected to each other through the at least one wiring member 263.

According to various embodiments, the electronic device 200 may include at least one battery 291 and 292. According to an embodiment, the at least one battery 291 and 292 may include a first battery 291, disposed in the first space 2101 of the first housing 210 and electrically connected to the first substrate 271, and a second battery 292, disposed in the second space 2201 of the second housing 220 and electrically connected to the second substrate 272. According to an embodiment, the first support member 261, and the second support member 262 may further include at least one swelling hole for the first battery 291 and the second battery 292.

According to various embodiments, the first housing 210 may include a first rotation support surface 214, and the second housing 220 may include a second rotation support surface 224 corresponding to the first rotation support surface 214. According to an embodiment, the first rotation support surface 214 and the second rotation support surface 224 may include curved surfaces corresponding to (naturally connected to) the curved outer surface of the hinge housing 310. According to an embodiment, when the electronic device 200 is in an unfolded state, the first rotation support surface 214 and the second rotation support surface 224 may cover the hinge housing 310 so that the hinge housing 310 is not exposed or only partially exposed through the rear surface of the electronic device 200. According to an embodiment, when the electronic device 200 is in a folded state, the first rotation support surface 214 and the second rotation support surface 224 may rotate along the curved outer surface of the hinge housing 310 so that the hinge housing 310 is at least partially exposed through the rear surface of the electronic device 200.

According to various embodiments, the electronic device 200 may include at least one antenna 276 disposed in the first space 2101. According to an embodiment, the at least one antenna 276 may be disposed at the first battery 291 and the first rear cover 240 in the first space 2101. According to an embodiment, the at least one antenna 276 may include, for example, a near-field communication (NFC) antenna, a wireless charging antenna, and/or a magnetic secure transmission (MST) antenna. According to an embodiment, the at least one antenna 276 may, for example, perform short-range communication with an external device or wirelessly transmit/receive power required for charging. In an embodiment, an antenna structure may be formed by at least a portion of the first side member 213 or the second side member 223 and/or at least a portion of the first support member 261 and the second support member 262 or a combination thereof.

According to various embodiments, the electronic device 200 may further include at least one electronic component assembly 274 and 275 and/or additional support members 263 and 273, disposed in the first space 2101 and/or the second space 2201. For example, the at least one electronic component assembly may include an interface connector port assembly 274 or a speaker assembly 275.

According to various embodiments, the electronic device 100 may include a first waterproof structure WP1, disposed between the first reinforcing plate 461 and the first support member 261, and a second waterproof structure WP2, disposed between the second reinforcing plate 462 and the second support member 262. According to an embodiment, the first waterproof structure WP1 may include a first waterproof member 481 disposed such that at least one first waterproof space 4811, 4812, or 4813 is formed between the first reinforcing plate 461 and the first support member 261. According to an embodiment, the second waterproof structure WP2 may include a second waterproof member 482, a third waterproof member 483, and a fourth waterproof member 484 arranged such that at least one second waterproof space 4821 is formed between the second reinforcing plate 462 and the second support member 262. According to an embodiment, the fourth waterproof member 484 may be disposed to connect stepped and spaced spaces of the second waterproof member 482 and the third waterproof member 483.

According to various embodiments, the at least one first waterproof space 4811 is a wiring structure for connecting an electronic component (e.g., the first digitizer panel 471 in FIG. 4), disposed between the first reinforcing plate 461 and the first support member 261, to the first space 2101 through the first waterproof member 481, and may be disposed to receive a through-path for a cable member. According to an embodiment, the at least one second waterproof space 4821 is a wiring structure for connecting an electronic component (e.g., the second digitizer panel 472 in FIG. 4), disposed between the second reinforcing plate 462 and the second support member 262, to the second space 2201 through the second waterproof member 482, the third waterproof member 483, and the fourth waterproof member 484, and may be disposed to receive a through-path for a capable member. According to an embodiment, the at least one first waterproof space 4812 or 4813 may receive an area corresponding to an electronic component (e.g., a camera module or a sensor module) disposed to be supported by the first support member 261. According to an embodiment, the at least one second waterproof space 4821 may receive at least a portion of a bending portion (e.g., the bending portion 432 in FIG. 4) which is folded toward the rear surface of the first display 230. For example, the at least one second waterproof space 4821 may be disposed to surround at least a portion of the bending portion 432 which extends from a display (e.g., the display panel 430 in FIG. 4) of the first display 230 and is folded toward the rear surface of the first display 230. Therefore, a control circuit (e.g., the control circuit 4321a in FIG. 4) and multiple electrical element (not shown), disposed in the bending portion 432, may be disposed in the at least one second waterproof space 4821, and thus may be protected from external moisture and/or foreign mater.

In the electronic device 200 according to an example embodiment of the disclosure, the at least one waterproof member 481, 482, 483, or 484 may include at least one waterproof structure WP1 or WP2 disposed between the first support member 261 of the first housing 210 and the first reinforcing plate 461 and/or between the second support member 262 of the second housing 220 and the second reinforcing plate 462. Therefore, when the first display 230 is separated from the housings 210 and 220 in order to maintain the electronic device 200, damage to the first display through the waterproof member may be reduced. Furthermore, the at least one waterproof member 481, 482, 483, or 484 may be disposed to avoid the rear surface of the first display 230, thereby improving external visibility and helping to ensure surface quality.

Figure 4:
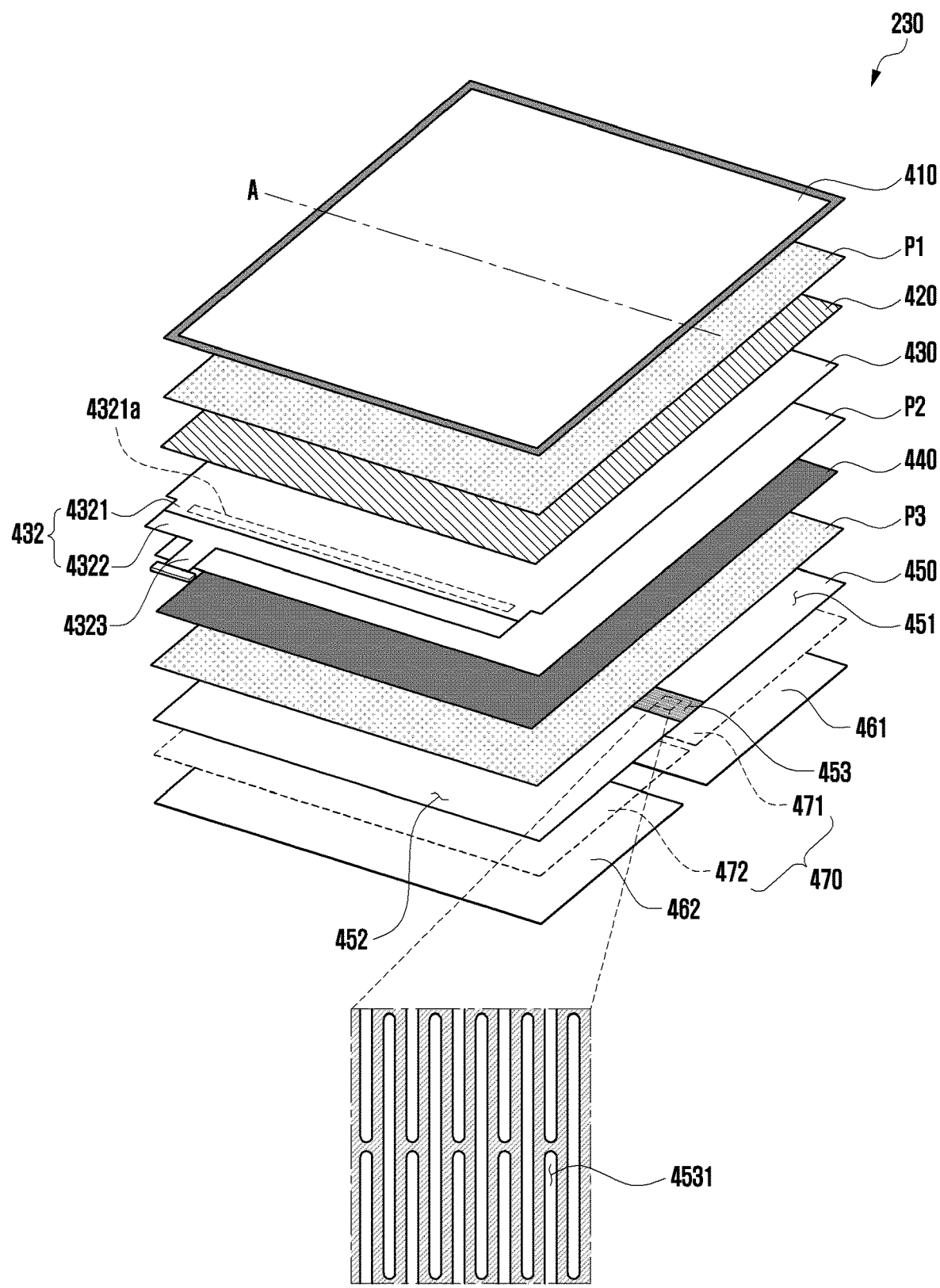
FIG. 4 is an exploded perspective view of a first display according to various embodiments.

FIG. 4 is an exploded perspective view of a display module according to various embodiments. The display module in FIG. 4 may be an example of the first display (e.g., the first display 230 in FIGS. 1A and 3) described above with reference to FIGS. 1A and 3.

A flexible display module 230 according to an example embodiment of the disclosure may include an unbreakable (UB)-type OLED display (e.g., a curved display). However, the disclosure is not limited thereto, and the flexible display module 230 may include a flat-type display of an on-cell touch active-matrix organic light-emitting diode (AMOLED) (OCTA) type.

Referring to FIG. 4, the flexible display module 230 may include a window layer 410, and a polarizer (POL) 420 (e.g., a polarizing film), a display panel 430, a polymer layer 440, a support plate 450, and the reinforcing plates 461 and 462, which are sequentially disposed on the rear surface (e.g., the −z-axis direction) of the window layer 410. In an embodiment, the flexible display module 230 may include a digitizer panel 470 disposed between the support plate 450 and the reinforcing plates 461 and 462. In an embodiment, the digitizer panel 470 may be disposed between the polymer layer 440 and the support plate 450.

According to various embodiments, the window layer 410 may include a glass layer. According to an embodiment, the window layer 410 may include ultra-thin glass (UTG). In an embodiment, the window layer 410 may include polymer. In this case, the window layer 410 may include polyethylene terephthalate (PET) or polyimide (PI). In an embodiment, the window layer 410 may be disposed as multiple layers to include a glass layer and a polymer.

According to various embodiments, the window layer 410, the polarizer 420, the display panel 430, the polymer layer 440, and the support plate 450 may be arranged to at least partially traverse a first surface (e.g., the first surface 211 in FIG. 1A) of a first housing (e.g., the first housing 210 in FIG. 1A) and a third surface (e.g., the third surface 221 in FIG. 1A) of a second housing (e.g., the second housing 220 in FIG. 1A). According to an embodiment, the reinforcing plates 461 and 462 may include a first reinforcing plate 461 corresponding to the first housing (e.g., the first housing 210 in FIG. 1A) and a second reinforcing plate 462 corresponding to the second housing (e.g., the second housing 220 in FIG. 1A). According to an embodiment, the reinforcing plates 461 and 462 may provide rigidity for the flexible display module 230 and may be used as a ground to prevent and/or reduce malfunction of the flexible display module 230. According to an embodiment, the reinforcing plates 461 and 462 may be formed of a metal material. According to an embodiment, the reinforcing plates 461 and 462 may be formed of SUS or AL. According to an embodiment, the window layer 410, the polarizer 420, the display panel 430, the polymer layer 440, the support plate 450, and the reinforcing plates 461 and 462 may be attached to each other through adhesives P1, P2, and P3 (or bonding agents). For example, the adhesives P1, P2, and P3 may include at least one among an optical clear adhesive (OCA), a pressure sensitive adhesive (PSA), a heat sensitive adhesive, a normal adhesive, or a double-sided tape.

According to various embodiments, the display panel 430 may include multiple pixels and a wiring structure (e.g., electrode pattern). According to an embodiment, the polarizer 420 may selectively allow light, generated from a light source of the display panel 430 and vibrating in a predetermined direction, to pass therethrough. According to an embodiment, the display panel 430 and the polarizer 420 may be integrally formed. According to an embodiment, the flexible display module 230 may include a touch panel (not shown).

According to various embodiments, the polymer layer 440 may be disposed under the display panel 430 so as to provide a dark background for ensuring the visibility of the display panel 430, and may be formed of a cushion material for a cushioning action. In an embodiment, for waterproofing of the flexible display module 230, the polymer layer 440 may be removed or may be disposed under the support plate 450.

According to various embodiments, the support plate 450 may provide a bending characteristic to the flexible display module 230. For example, the support plate 450 may be formed of a non-metal thin plate-type material, such as fiber reinforced plastics (FRP) (e.g., carbon fiber reinforced plastics (CFRP) or glass fiber reinforced plastics (GFRP)) having rigid properties for supporting the display panel 430. According to an embodiment, the support plate 450 may include a first flat portion 451 corresponding to the first housing (e.g., the first housing 210 in FIG. 1A), a second flat portion 452 corresponding to the second housing (e.g., the second housing 220 in FIG. 1A), and a bending portion 453 (a flexible portion or a bending portion) connecting the first flat portion 451 to the second flat portion 452. According to an embodiment, the bending portion 453 may include multiple openings 4531 disposed at designated intervals. According to an embodiment, the bending characteristic of the bending portion 453 may be determined through at least one among the size, the shape, or the arrangement density of at least some of the multiple openings 4531. In an embodiment, the support plate 450 may be formed of a metal material such as steel use stainless (SUS) (e.g., stainless steel (STS)), Cu, Al, or metal CLAD (e.g., a stacked member in which SUS and Al are alternately disposed). In this case, multiple openings may be formed through the entire area of the support plate 450 such that a detection operation of the digitizer panel 470 disposed thereunder is induced. According to an embodiment, the support plate 450 may help reinforce the rigidity of the electronic device (e.g., the electronic device 200 in FIG. 1A), may shield ambient noise, and may be used to dissipate heat emitted from ambient heat-emitting components.

According to various embodiments, the display 230 may include the digitizer panel 470 as a detection member which is disposed under the support plate 450 and receives an input of an electronic pen (e.g., a stylus). According to an embodiment, the digitizer panel 470 may include coil members disposed on a dielectric substrate (e.g., a dielectric film or a dielectric sheet) so as to detect an electromagnetic induction resonance frequency applied from the electronic pen. According to an embodiment, the digitizer panel 470 may include a first digitizer panel 471 corresponding to the first housing (e.g., the first housing 210 in FIG. 1A) and a second digitizer panel 472 corresponding to the second housing (e.g., the second housing 220 in FIG. 1A). According to an embodiment, the first digitizer panel 471 and the second digitizer panel 472 may be electrically connected to substrates (e.g., the substrates 271 and 272 in FIG. 3) of the electronic device (e.g., the electronic device 200 in FIG. 3) through cable members, respectively, so as to operate as one digitizer panel. In an embodiment, the first digitizer panel 471 and the second digitizer panel 472 may individually operate.

According to various embodiments, the flexible display module 230 may include at least one functional member (not shown) disposed between the polymer layer 440 and the support plate 450 or under the support plate 450. According to an embodiment, the functional member may include a graphite sheet for heat dissipation, an added display, a force touch FPCB, a fingerprint sensor FPCB, an antenna radiator for communication, or a conductive/non-conductive tape. According to an embodiment, the functional member may be separately disposed in the first housing (e.g., the first housing 210 in FIG. 1A) and the second housing (e.g., the second housing 220 in FIG. 1A) when the functional member cannot be bent. According to an embodiment, the functional member may be disposed, when the functional member can be bent, from the first housing (e.g., the first housing 210 in FIG. 1A) to at least a portion of the second housing (e.g., the second housing 220 in FIG. 1A) via the hinge device (e.g., the hinge device 320 in FIG. 3).

According to various embodiments, the flexible display module 230 may include a bending portion 432 disposed to be folded from the display panel 430 toward at least a partial area of the rear surface (e.g., the −z-axis direction) of the flexible display module 230. According to an embodiment, the bending portion 432 may include an extension portion 4321 extending from the display panel 430 and including a control circuit 4321a, and a flexible substrate 4322 electrically connected to the extension portion 4321 and including multiple electrical elements. According to an embodiment, the control circuit 4321a may include a display driver IC (DDI) or a touch display driver IC (TDDI) mounted on the extension portion 4321 having an electrical wiring structure. According to an embodiment, the control circuit 4321a may have a chip on panel or chip on plastic (COP) structure in which the control circuit 4321a is directly disposed in the extension portion 4321. In an embodiment, the control circuit 4321a may have a chip on film (COF) structure in which the control circuit 4321a is mounted to a separate connecting film (not shown) which connects the extension portion 4321 to the flexible substrate 4322. According to an embodiment, the flexible display module 230 may include multiple electrical elements (not shown) disposed on the flexible substrate 4322. According to an embodiment, the flexible display module 230 may include a cable member 4323 extending from the flexible substrate 4322 and electrically connected to a substrate (e.g., the second substrate 272 in FIG. 3) of the electronic device (e.g., the electronic device 200 in FIG. 3). According to an embodiment, the multiple electrical elements may include a touch IC, a flash memory for a display, a diode for preventing and/or reducing ESD, a pressure sensor, a fingerprint sensor, or a passive component such as decap. In an embodiment, when the bending portion 432 is disposed in an area of the flexible display module 230 facing the first housing (e.g., the first housing 210 in FIG. 1A), the cable member 4323 may be electrically connected to another substrate (e.g., the first substrate 271 in FIG. 3) of the electronic device (e.g., the electronic device 200 in FIG. 3).

According to example embodiments of the disclosure, the electronic device (e.g., the electronic device 200 in FIG. 3) may include a wiring structure of a cable member drawn out from the digitizer panel 470 disposed on the rear surface of the flexible display module 230, and a waterproof structure provided to protect, from external moisture and/or foreign matter, at least a portion (e.g., the extension portion 4321) of the bending portion 432, which is bent toward the rear surface of the flexible display module 230 and includes the control circuit 4321a and multiple electrical elements, and areas corresponding to at least one electronic component (e.g., a camera module or a sensor module) disposed through the support members 461 and 462.

The above-mentioned display module 230 is only an example for describing the disclosure, and the display module 230 is not required to necessarily include all of the above-described elements. Therefore, the display module 230 may be configured by omitting or adding some of the above-described elements or be omitted.

Figure 5:
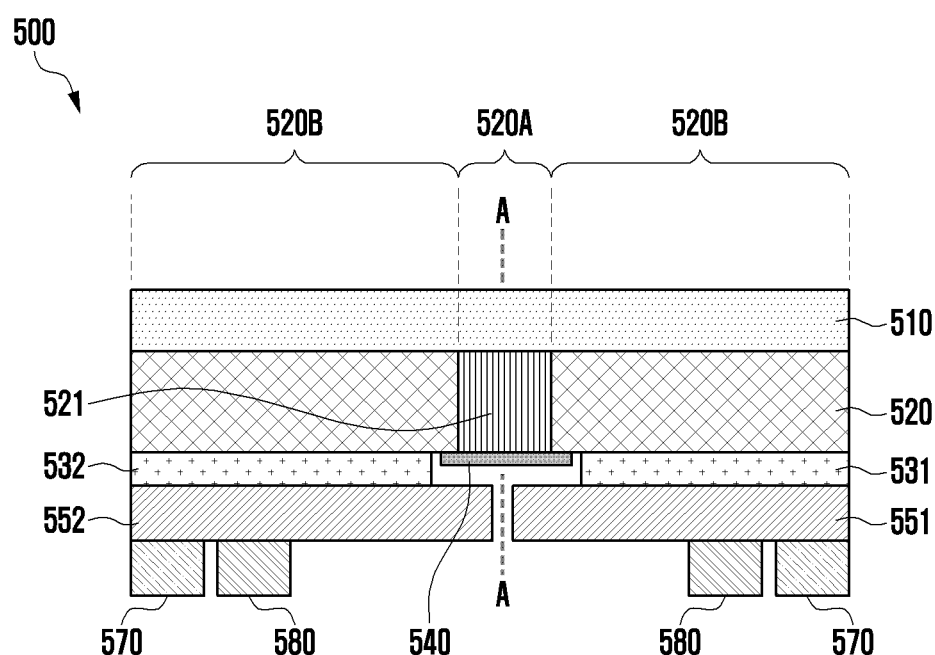
FIG. 5 is a cross-sectional view of a display module according to various embodiments.
Figure 5:
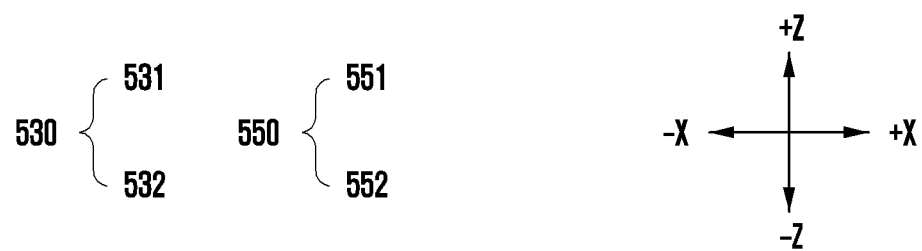

FIG. 5 is a cross-sectional view of a display module according to various embodiments. FIG. 5 may be across-sectional view of the display module illustrated in FIG. 1A, taken along line B-B according to various embodiments.

A display module 500 described below may include at least one of the elements of the display module 230 described with reference to FIG. 4. However, display module 500 may include a structure different from the structure (e.g., the stacked structure) of the display module 230 described with reference to FIG. 4.

FIG. 5 is provided for convenience of description of various embodiments disclosed herein. The display module 500 may further include other elements in addition to the elements of the display module 230 illustrated in FIG. 4. In addition, the size relationship between the elements illustrated in FIG. 5 is not limited to that illustrated in FIG. 5 unless otherwise specified.

In various embodiments, the display module 500 may include a display panel 510 (e.g., the display panel 430 in FIG. 4), a support plate 520 (e.g., the support plate 450 in FIG. 4), a cushion layer 530, a foreign material blocking member 540, a reinforcing plate 550 (e.g., the reinforcing plates 461 and 462 in FIG. 4), and a waterproof member 570 (e.g., the waterproof members 481, 482, and 483 in FIG. 3).

According to various embodiments, the display panel 510 may include multiple light-emitting elements (e.g., organic light emitting diodes (OLEDs)) so as to display visual information, and may include a thin film transistor (TFT) connected to the light-emitting elements. The display panel 510 may be formed such that a partial area thereof is deformable. In the display panel 510, a portion disposed between the first housing and the second housing may be deformed based on the rotation of a second housing (e.g., the second housing 220 in FIG. 1A) with respect to a first housing (e.g., the first housing 210 in FIG. 1A) (e.g., folding of the first housing and the second housing). A substrate included in the display panel 510 may be formed of a flexible material so that the display panel 510 can be deformed. For example, the substrate of the display panel 510 may be formed of a polymer material such as polyethylene terephthalate (PET) or poly imide (PI).

According to various embodiments, the support plate 520 may be disposed on the rear surface of the display panel 510 to support the display panel 510. For example, the support plate 520 may be formed a not-metal thin plate-type material, such as fiber reinforced plastics (FRP) (e.g., carbon fiber reinforced plastics (CFRP) or glass fiber reinforced plastics (GFRP)) having rigid properties for supporting the display panel 510. In an embodiment, the support plate 520 may include a first area 520A (e.g., the bending portion 453 in FIG. 4) formed to be more easily deformed than other portions in order to support the display panel 510 deformed by folding of the first housing and the second housing. The first area 520A may be an area corresponding to a deformable portion of the display panel 510 (e.g., a portion between the first housing and the second housing). In the following description, the support plate 520 will be divided into the first area 520A and second areas 520B and described. It may be understood that the first area 520A is an area corresponding to a deformable area of the display panel 510 and the second areas 520B are the remaining areas of the support plate 520 other than the first area 520A. In an embodiment, multiple openings 521 (e.g., the openings 4531 in FIG. 4) disposed at predetermined intervals may be formed the first area 520A. Deformation characteristics of the support plate 520 may be determined by adjusting at least one of the size, shape, arrangement, or density of the multiple openings 521. Due to the multiple openings 521, the first area 520A may have, for example, a lattice shape. Due to the multiple openings 521 formed in the first area 520A, the first area 520A may have a relatively flexible characteristic compared with the second areas 520B. In an embodiment, in order to facilitate deformation of the first area 520A, the thickness of the support plate 520 in the first area 520A may be less than the thickness of the support plate 520 in the second areas 520B. In this case, the first area 520A may not include the multiple openings 521. In an embodiment, the support plate 520 may be formed of a metal material such as steel use stainless (SUS) (e.g., stainless steel (STS)), Cu, Al, or metal CLAD (e.g., a stacked member in which SUS and Al are alternately disposed). The support plate 520 formed of a metal material may help to reinforce the rigidity of an electronic device (e.g., the electronic device 200 in FIG. 1A), may shield ambient noise, and may be used to dissipate heat emitted from ambient heat-emitting components.

According to various embodiments, the cushion layer 530 may be disposed on the rear surface of the support plate 520. Since the reinforcing plate 550 is disposed on the rear surface of the cushion layer 530, the cushion layer 530 may be disposed between the support plate 520 and the reinforcing plate 550. In an embodiment, the cushion layer 530 may be formed of a material capable of cushioning external impact applied to the display module 500. The cushion layer 530 may include a porous foam material (e.g., a sponge) so as to be deformed by an external force to cushion impact. In addition, the cushion layer 530 can contain various materials capable of cushioning an external force. The external force applied to the display module 500 may be cushioned by the cushion layer 530, and thus the rigidity of the display may be improved. The cushion layer 530 may be disposed to occupy most of the rear surface of the support plate 520, thereby reducing a portion where the cushion layer 530 is not disposed. For example, when the cushion layer 530 is disposed on the rear surface of the reinforcing plate 550 which will be described later, the space for arrangement of the cushion layer 530 may be reduced by the waterproof member 570 and a shielding member 580 disposed on the rear surface of the reinforcing plate 550. The display module 500 according to various embodiments disclosed herein may include a structure in which the cushion layer 530 is disposed between the support plate 520 and the reinforcing plate 550 such that the cushion layer 530 can be disposed in a larger area. Unlike the reinforcing plate 550, the waterproof member 570 or the shielding member 580 is not disposed on the rear surface of the support plate 520, so the cushion layer 530 may be disposed in a larger area. In this way, an external force applied to the display module 500 may be effectively offset by disposing the cushion layer 530 in a large area. Accordingly, the problem that the display module 500 is easily damaged by the external force may be reduced. For example, various elements are disposed on portions corresponding to both ends of the rotation axis (e.g., the rotation axis A-A in FIG. 1A) of the electronic device, and the portions may have poor durability. In various embodiments disclosed herein, since the cushion layer 530 may be disposed up to the portions corresponding to both ends of the rotation axis, the durability of the electronic device may be improved as a whole.

Referring to FIG. 5, the cushion layer 530 may be disposed on the rear surface of the support plate 520 at positions corresponding to the second areas 520B of the support plate 520. For example, the cushion layer 530 may not be disposed in a position corresponding to the first area 520A of the support plate 520. The description that the cushion layer 530 is disposed in the second areas 520B and is not disposed in the first area 520A may be made for describing the main arrangement area of the cushion layer 530. In an embodiment, the cushion layer 530 may be disposed in a portion of the second areas 520B, and a portion of the cushion layer 530 may be disposed to extend to a portion of the first area 520A. Referring to FIG. 5, the cushion layer 530 may include two cushion layers 530 separated from each other with reference to the rotation axis A-A of the electronic device. For example, the cushion layer 530 may include a first cushion layer 531 disposed on the rear surface of the support plate 520 in a first housing, and a second cushion layer 532 disposed on the rear surface of the support plate 520 in a second housing. The first cushion layer 531 and the second cushion layer 532 may be disposed in the second areas 520B of the support plate 520, respectively. In an embodiment, the cushion layer 530 may be formed integrally without being segmented. In this case, the cushion layer 530 may be disposed in a position corresponding to the first area 520A.

According to various embodiments, the foreign material blocking member 540 may be disposed on the rear surface of the support plate 520. The foreign material blocking member 540 may be disposed on the rear surface of the support plate 520 in a position corresponding to the first area 520A of the support plate 520. In an embodiment, a portion of the foreign material blocking member 540 may be disposed up to the second area 520B of the support plate 520. The description that the foreign material blocking member 540 is disposed in the first area 520A may be understood as a description that a main portion of the foreign material blocking member 540 is disposed in the first area 520A of the support plate 520. The first area 520A of the support plate 520 may be covered by the foreign material blocking member 540. The foreign material blocking member 540 may cover the openings 521 formed in the first area 520A of the support plate 520 to block foreign matter that may be introduced through the openings 521. The foreign material blocking member 540 may be formed of a stretchable material so as to be disposed in the first area 520A of the support plate 520 that is deformed by the folding of the first housing and the second housing. For example, the foreign material blocking member 540 may be formed of an elastomer which is a polymer material having elasticity. In an embodiment, the foreign material blocking member 540 may include thermoplastic polyurethane (TPU). As illustrated in FIG. 5, the foreign material blocking member 540 and the cushion layer 530 may be disposed on the rear surface of the support plate 520. The foreign material blocking member 540 may be disposed at a position corresponding to the first area 520A of the support plate 520, and the cushion layer 530 may be disposed at a position corresponding to the first area 520A of the support plate 520. In an embodiment, the foreign material blocking member 540 and the cushion layer 530 may have different thicknesses. For example, the thickness of the foreign material blocking member 540 may be smaller than the thickness of the cushion layer 530. In an embodiment, the foreign material blocking member 540 and the cushion layer 530 may be formed of different materials. In an embodiment, the foreign material blocking member 540 and the cushion layer 530 may be integrally formed.

According to various embodiments, the reinforcing plate 550 may be disposed under the support plate 520. The reinforcing plate 550 may include a first reinforcing plate 551 disposed in the first housing and a second reinforcing plate 552 disposed in the second housing. The first reinforcing plate 551 and the second reinforcing plate 552 may be disposed on the rear surface of the cushion layer 530. The first reinforcing plate 551 may be disposed on the rear surface of the first cushion layer 531, and the second reinforcing plate 552 may be disposed on the rear surface of the second cushion layer 532. The reinforcing plate 550 may provide rigidity for the display module 500, and may be used as a ground for preventing and/or reducing malfunction of the display module 500. In an embodiment, the reinforcing plate 550 may be formed of a metal material. For example, the reinforcing plate 550 may be formed of SUS or AL.

According to various embodiments, various elements may be disposed on the rear surface of the reinforcing plate 550. For example, the waterproof member 570 and the shielding member 580 may be disposed on the rear surface of the reinforcing plate 550. The waterproof member 570 may be an element for blocking moisture or foreign matter introduced from outside the electronic device. The waterproof member 570 may contain an adhesive material. A waterproof space (e.g., the waterproof spaces 4811, 4812, 4813, and 4821 in FIG. 3) may be formed by a portion surrounded by the waterproof member 570. The risk of introduction external moisture into the waterproof space formed by the waterproof member 570 is low. Therefore, an electric object may be protected from external moisture by disposing the electric object in this portion. The shielding member 580 may be formed of a material capable of shielding an electric field or a magnetic field. The shielding member 580 may shield the magnetic force of a magnetic member (e.g., a magnet for fixing the folded state of the first housing and the second housing) included in the electronic device.

Figure 6A:
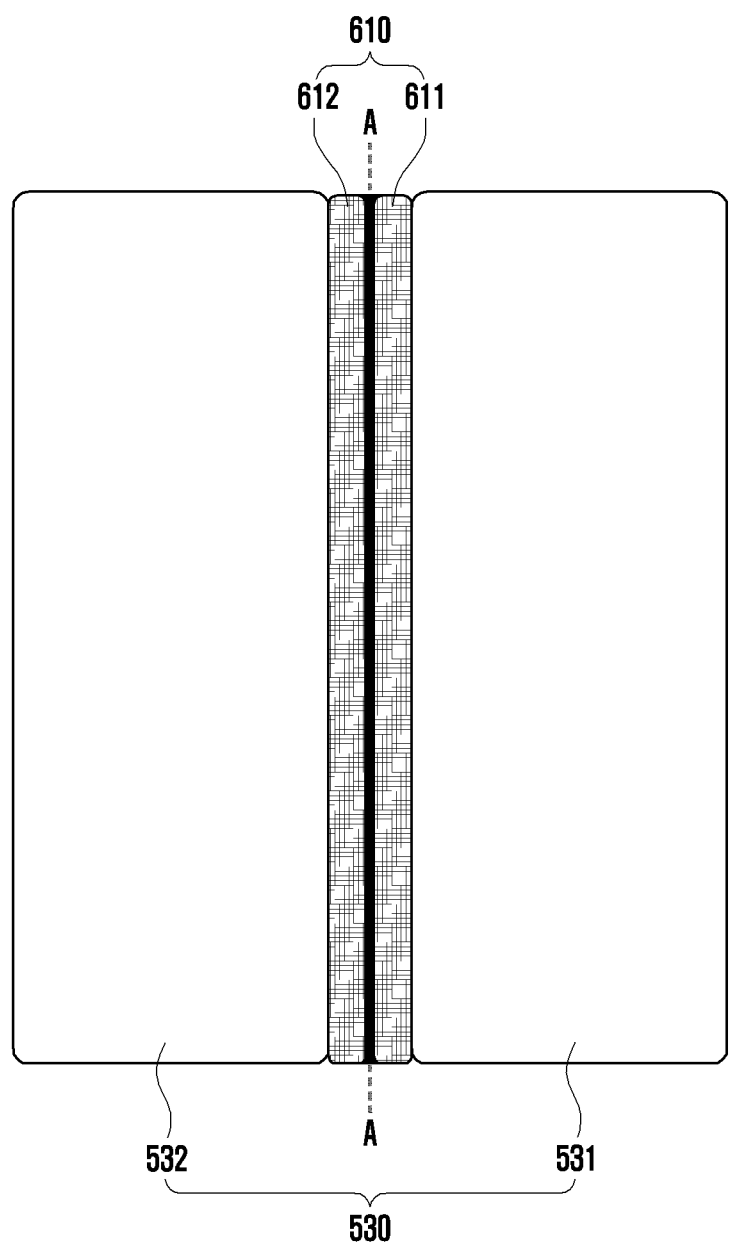
FIG. 6A is a diagram illustrating a plan view of a cushion layer and a first reinforcing member according to various embodiments.
Figure 6B:
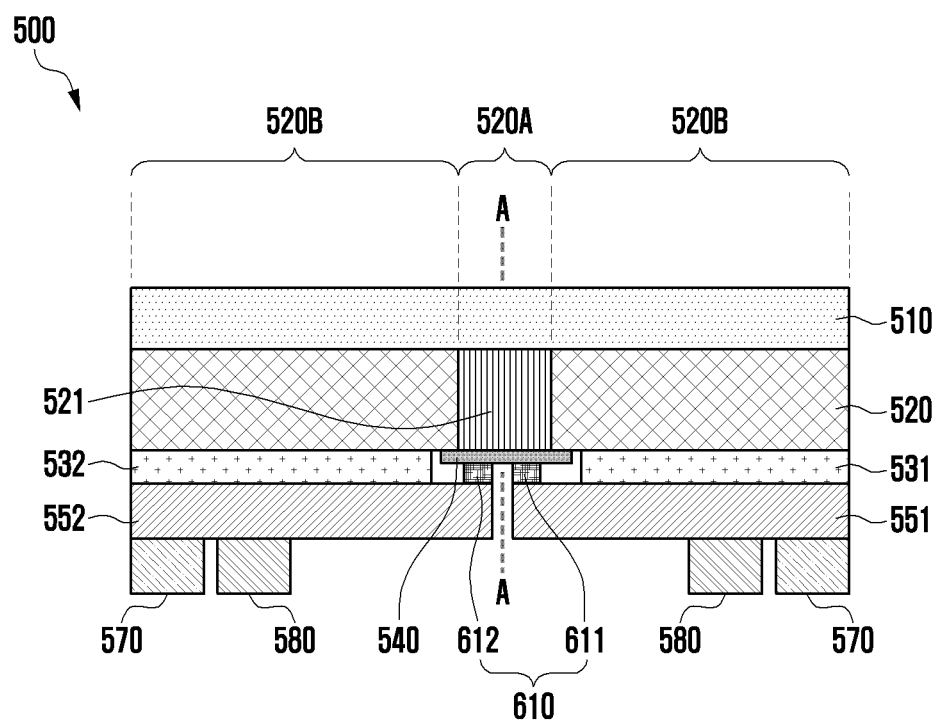
FIG. 6B is a cross-sectional view of a display module according to various embodiments.

FIG. 6A is a diagram illustrating a plan view of a cushion layer and a first reinforcing member according to various embodiments. FIG. 6B is a cross-sectional view of a display module according to various embodiments. FIG. 6B may be a cross-sectional view of a display module illustrated in FIG. 1A, taken along line B-B according to various embodiments.

Since a display module 500 illustrated in FIGS. 6A and 6B is similar to the display module 500 described with reference to FIG. 5, the same reference numerals will be used for the elements described with reference to FIG. 5 and detailed descriptions thereof may not be repeated.

According to various embodiments, the display module 500 may further include a first reinforcing member 610. As illustrated in FIG. 6B, the first reinforcing member 610 may be disposed on the rear surface of a foreign material blocking member 540. The first reinforcing member 610 may include a (1-1)th reinforcing member 611 and the (1-2)th reinforcing member 612 separated from each other around a rotation axis A-A of an electronic device. The first reinforcing member 610 may be disposed between the foreign material blocking member 540 and a reinforcing plate 550.

In an embodiment, the first reinforcing member 610 may be formed of a material different from the foreign material blocking member 540. The first reinforcing member 610 may be formed of a reinforcing material having higher strength than the foreign material blocking member 540. For example, the first reinforcing member 610 may contain PET. The first reinforcing member 610 may support the foreign material blocking member 540 disposed in a first area 520A of a support plate 520 corresponding to a deformable area of the display module 500. Creases may be made in the deformable area of the display module 500 due to various factors including deformation of the multiple openings 521 included in the first area 520A of the support plate 520. By disposing the first reinforcing member 610 in a position corresponding to the first area 520A, the deformable area of the display module 500 may be reinforced, and thus the creases made in the deformable area of the display module 500 may be reduced.

Figure 7A:
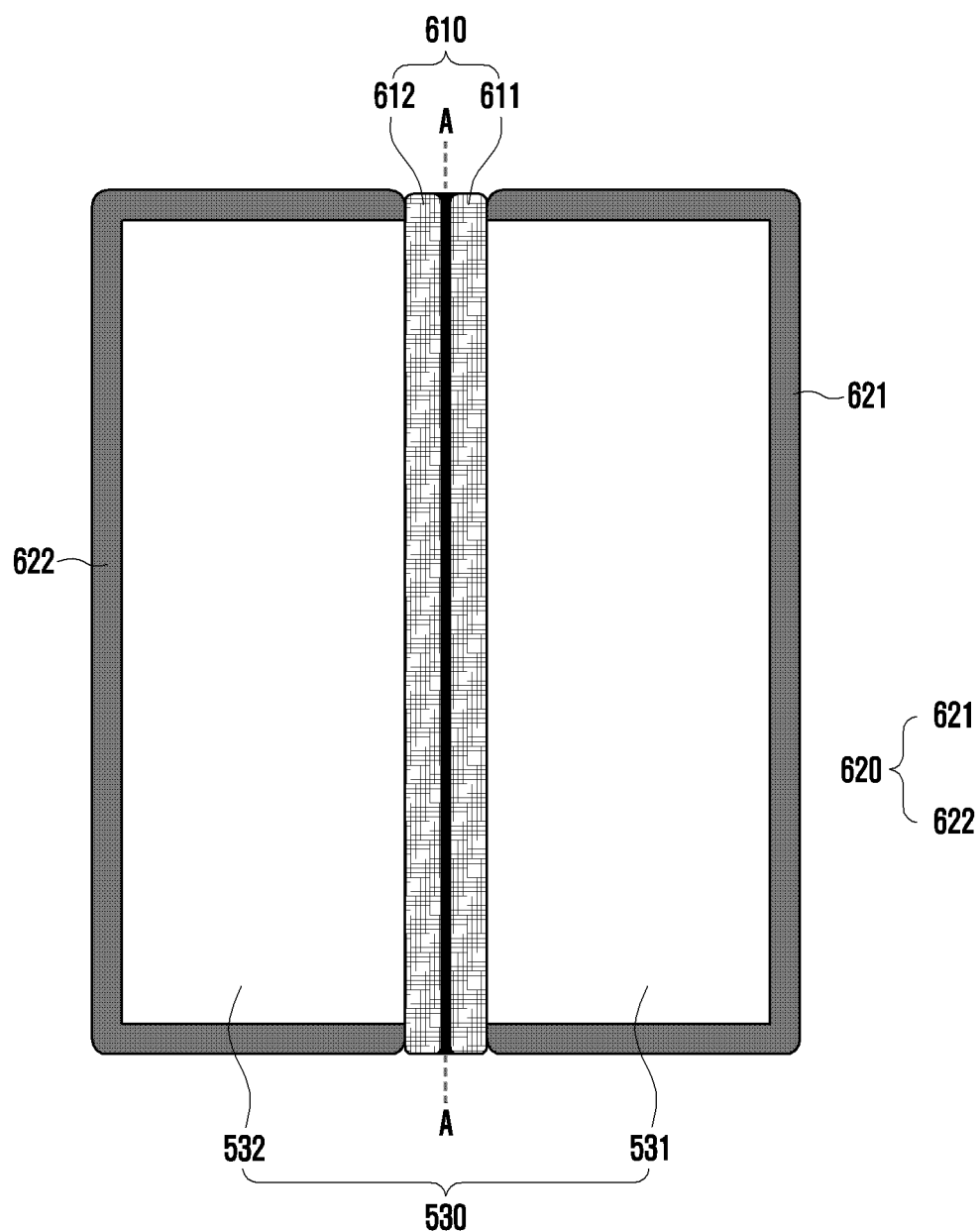
FIG. 7A is a diagram illustrating a plan view of a cushion layer, a first reinforcing member, and a second reinforcing member according to various embodiments.
Figure 7B:
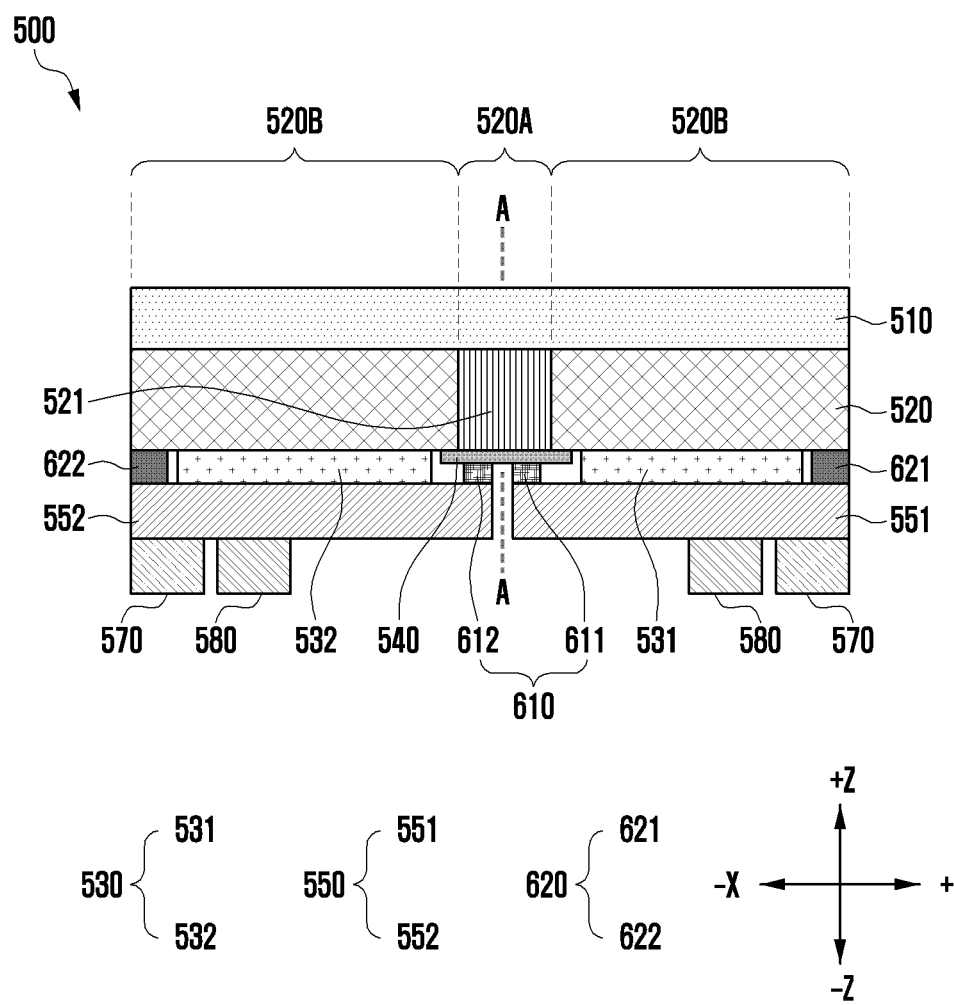
FIG. 7B is a cross-sectional view of a display module according to various embodiments.

FIG. 7A is a diagram illustrating a plan view of a cushion layer, a first reinforcing member, and a second reinforcing member according to various embodiments. FIG. 7B is a cross-sectional view of a display module according to various embodiments. FIG. 7B may be a cross-sectional view of the display module illustrated in FIG. 1A, taken along line B-B according to various embodiments.

Since a display module 500 illustrated in FIGS. 7A and 7B is similar to the display module 500 described with reference to FIG. 6B, the same reference numerals will be used for the elements described with reference to FIG. 6 and detailed descriptions thereof may not be repeated.

According to various embodiments, the display module 500 may further include a second reinforcing member 620. In an embodiment, the second reinforcing member 620 may be disposed on the rear surface of a support plate 520 in a first area 520A of the support plate 520. The second reinforcing member 620 may be disposed in a position corresponding to the outer peripheral area of the first area 520A. Referring to FIG. 7B, the cushion layer 530 and the second reinforcing member 620 may be disposed on the rear surface of the first area 520A of the support plate 520. The second reinforcing member 620 may be disposed between the support plate 520 and the reinforcing plate 550. The second reinforcing member 620 may include a (2-1)th reinforcing member 621 and a (2-2)th reinforcing member 622 separated from each other around the rotation axis A-A of an electronic device.

Referring to FIG. 7B, when the display module 500 is viewed from the front direction (e.g., the +Z direction in FIG. 7B), the second reinforcing member 620 may overlap a waterproof member 570 disposed on the rear surface of a reinforcing plate 550. The second reinforcing member 620 may be formed of a material different from the cushion layer 530. The second reinforcing member 620 may be formed of a material having higher strength than the cushion layer 530. For example, the second reinforcing member 620 may contain PET.

In an embodiment, in order to prevent and/or reduce moisture from being introduced into a waterproof space formed by the waterproof member 570, it is necessary to provide sufficient pressing force to the waterproof member 570 so that the waterproof member 570 is sufficiently tightly attached to other elements. The second reinforcing member 620, which has relatively high strength compared with the cushion layer 530, may be disposed at a portion at which the second reinforcing member 620 overlaps the waterproof member 570, whereby the pressing force provided in the process of pressing the display module 500 for attachment of the waterproof member 570 may be sufficiently transmitted to the waterproof member 570. Therefore, since the waterproof member 570 may be sufficiently tightly attached to other elements, the introduction of moisture into the water space formed by the waterproof member 570 may be reduced.

According to various embodiments, the second reinforcing member 620 may be formed of the same material as the first reinforcing member 610. The second reinforcing member 620 may be formed to be thicker than the first reinforcing member 610.

FIGS. 7A and 7B illustrate the display module 500 including both the first reinforcing member 610 and the second reinforcing member 620. However, the first reinforcing member 610 may be omitted, thereby configuring the display module 500 including only the second reinforcing member 620.

Figure 8:
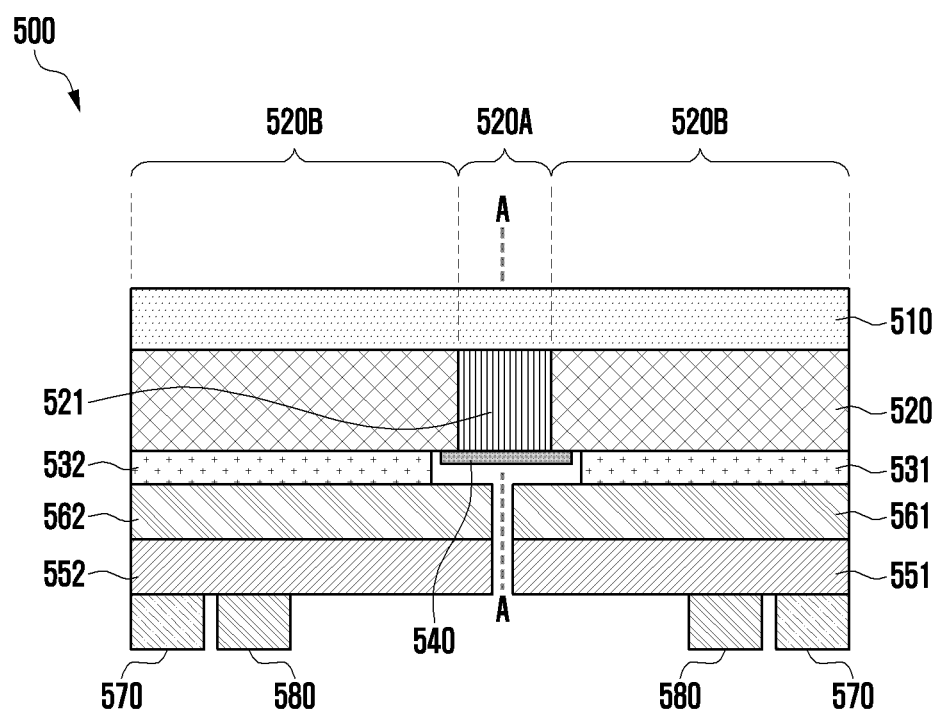
FIG. 8 is a cross-sectional view of a display module according to various embodiments.
Figure 8:
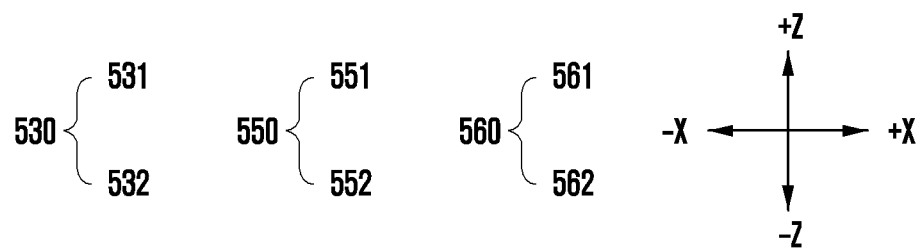

FIG. 8 is a cross-sectional view of a display module according to various embodiments. FIG. 8 may be a cross-sectional view of the display module illustrated in FIG. 1A, taken along line B-B according to various embodiments.

Since a display module 500 illustrated in FIG. 8 is similar to the display module 500 described with reference to FIG. 5, the same reference numerals will be used for the elements described with reference to FIG. 5 and detailed descriptions thereof may not be repeated.

According to various embodiments, the display module 500 may further include a digitizer panel 560 (e.g., the digitizer panel 470 in FIG. 4). The digitizer panel 560 may be an element for recognizing an input of a pen input device (e.g., stylus pen). The digitizer panel 560 may include coil members disposed on a dielectric substrate (e.g., a dielectric film or a dielectric sheet) so as to detect an electromagnetic induction resonance frequency applied from the pen input device. Referring to FIG. 8, the digitizer panel 560 may include a first digitizer panel 561 and a second digitizer panel 562 separated from each other. The first digitizer panel 561 may be disposed in the first housing (e.g., the first housing 210 in FIG. 1A), and the second digitizer panel 562 may be disposed in the second housing (e.g., the second housing 220 in FIG. 1A).

According to various embodiments, the cushion layer 530 may be disposed on the rear surface of the support plate 520 and disposed between the support plate 520 and the digitizer panel 560. Referring to FIG. 8, when the display module 500 is view from the front direction (e.g., the +Z direction in FIG. 8), the digitizer panel 560 may be covered by the cushion layer 530. The cushion layer 530 may contain a material having low light transmittance. Therefore, a phenomenon in which a coil member or a wire included in the digitizer panel 560 is view through the front surface of the display module 500 may be reduced.

According to various embodiments, the foreign material blocking member 540 may be disposed on the rear surface of the support plate 520 and disposed between the support plate 520 and the digitizer panel 560.

Figure 9:
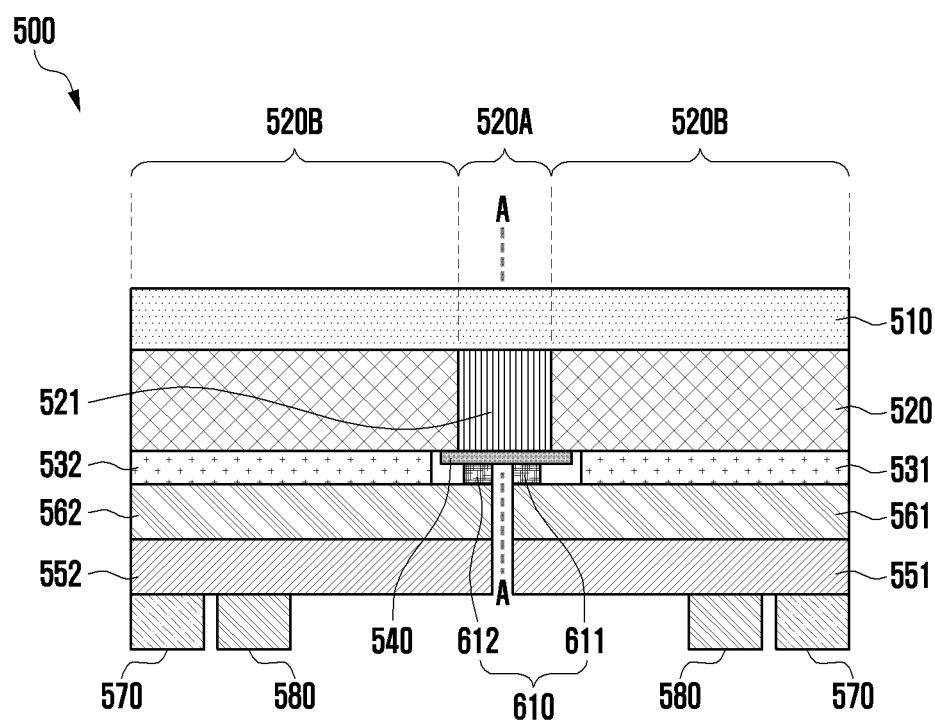
FIGS. 9 and 10 are cross-sectional views of a display module according to various embodiments.
Figure 10:
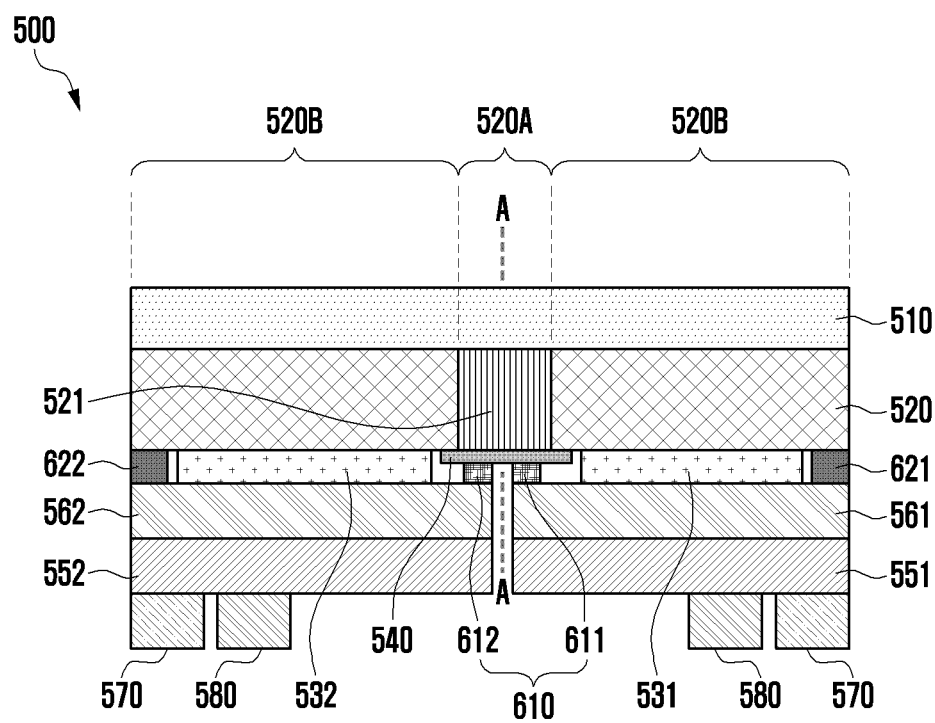

FIGS. 9 and 10 are cross-sectional views of a display module according to various embodiments. FIGS. 9 and 10 may be cross-sectional views of the display module illustrated in FIG. 1A, taken along line B-B according to various embodiments.

A display module 500 illustrated in FIGS. 9 and 10 is similar to the display module 500 described with reference to FIG. 8, the same reference numerals will be used for the elements described with reference to FIG. 8 and detailed descriptions thereof may not be repeated.

According to various embodiments, the display module 500 including a digitizer panel 560 may further include a first reinforcing member 610 and/or a second reinforcing member 620.

According to various embodiments, as illustrated in FIG. 9, the first reinforcing member 610 may be disposed on the rear surface of a foreign material blocking member 540. The first reinforcing member 610 may include a (1-1)th reinforcing member 611 and a (1-2)th reinforcing member 612 separated from each other around the rotation axis A-A of an electronic device. The first reinforcing member 610 may be disposed between the foreign material blocking member 540 and the digitizer panel 560.

In an embodiment, the first reinforcing member 610 may be formed of a material different from the foreign material blocking member 540. The first reinforcing member 610 may be formed of a material having higher strength than the foreign material blocking member 540. For example, the first reinforcing member 610 may contain PET. The first reinforcing member 610 may support the foreign material blocking member 540 disposed in a first area 520A of a support plate 520 corresponding to a deformable area of the display module 500. Creases may be made in the deformable area of the display module 500 due to various factors including deformation of multiple openings 521 included in the first area 520A of the support plate 520. By disposing the first reinforcing member 610 in a position corresponding to the first area 520A, the deformable area of the display module 500 may be reinforced, and thus creases made in the deformable area of the display module 500 may be reduced.

According to various embodiments, as illustrated in FIG. 10, the display module 500 may further include a second reinforcing member 620. In an embodiment, the second reinforcing member 620 may be disposed on the rear surface of the support plate 520 in the first area 520A of the support plate 520. The second reinforcing member 620 may be disposed in a position corresponding to the outer peripheral area of the first area 520A. Referring to FIG. 10, the cushion layer 530 and the second reinforcing member 620 may be disposed on the rear surface of the first area 520A of the support plate 520. The second reinforcing member 620 may be disposed between the support plate 520 and the digitizer panel 560. The second reinforcing member 620 may include a (2-1)th reinforcing member 621 and a (2-2)th reinforcing member 622 separated from each other around the rotation axis A-A of the electronic device.

Referring to FIG. 10, when the display module 500 is viewed from the front direction (e.g., the +Z direction in FIG. 10), the second reinforcing member 620 may overlap a waterproof member 570 disposed on the rear surface of the reinforcing plate 550. The second reinforcing member 620 may be formed of a material different from the cushion layer 530. The second reinforcing member 620 may be formed of a material having higher strength than the cushion layer 530. For example, the second reinforcing member 620 may contain PET.

In an embodiment, in order to prevent and/or reduce moisture from being introduced into a waterproof space formed by the waterproof member 570, it is necessary to provide sufficient pressing force to the waterproof member 570 so that the waterproof member 570 is sufficiently tightly attached to other elements. The second reinforcing member 620, which has relatively high strength compared with the cushion layer 530, may be disposed at a portion at which the second reinforcing member 620 overlaps the waterproof member 570, whereby the pressing force provided in the process of pressing the display module 500 for attachment of the waterproof member 570 may be sufficiently transmitted to the waterproof member 570. Therefore, since the waterproof member 570 may be sufficiently tightly attached to other elements, the introduction of moisture into the water space formed by the waterproof member 570 may be reduced.

FIG. 10 illustrates the display module 500 including both the first reinforcing member 610 and the second reinforcing member 620. However, the first reinforcing member 610 may be omitted, thereby configuring the display module 500 including only the second reinforcing member 620.

Figure 11A:
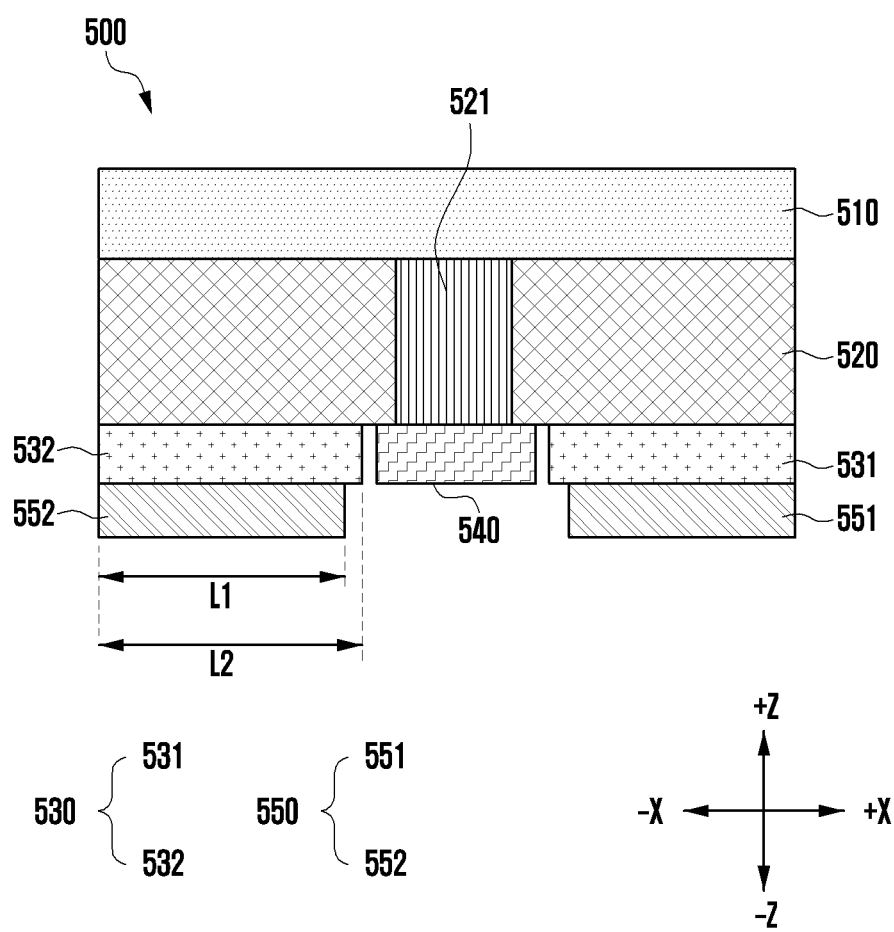
FIG. 11A is a cross-sectional view of a display module when an electronic device according to various embodiments disclosed herein is in an unfolded state according to various embodiments.
Figure 11B:
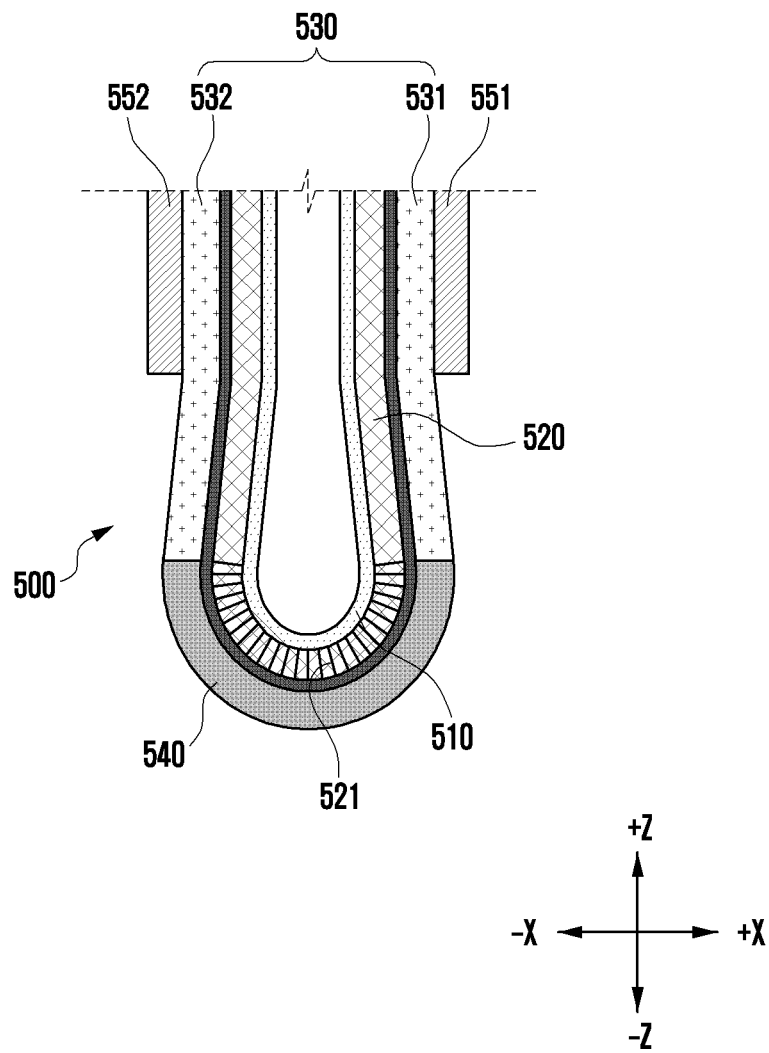
FIG. 11B is a cross-sectional view of a display module when an electronic device is in a folded state according to various embodiments.

FIG. 11A is a cross-sectional view of a display module when an electronic device is in an unfolded state according to various embodiments. FIG. 11B is a cross-sectional view of a display module when an electronic device is in a folded state according to various embodiments. The unfolded state of the electronic device may be the state illustrated in FIGS. 1A and 1B, and the folded state of the electronic device may be the state illustrated in FIGS. 2A and 2B.

According to various embodiments, the length of the reinforcing plate 550 and the length of the cushion layer 530 may be adjusted according to the curvature of a deformable portion of the electronic device. The cushion layer 530 is an elastic material, and thus may receive some deformation. Therefore, the cushion layer 530 may be disposed to extend to a portion of a deformable area of the display module 500 that is deformed according to the deformation of the electronic device. On the other hand, the reinforcing plate 550 may be formed of a relatively rigid material compared to the cushion layer 530. The reinforcing plate 550 may be disposed to avoid an area in which the display module 500 is deformed.

Referring to FIG. 11A, a length L2 of the cushion layer 530 extended in a first direction (e.g., the X-axis direction in FIG. 11A) may be different from a length L1 of the reinforcing plate 550 extended in the first direction. For example, the length L2 of the cushion layer 530 in the first direction may be greater than the length L1 of the reinforcing plate 550 in the first direction. The first direction may be a direction perpendicular to a direction in which the rotation axis A-A of the electronic device extends (e.g., the Y-axis direction in FIG. 1A). The length difference between the cushion layer 530 and the reinforcing plate 550 may increase as the radius of an area in which the display module 500 is deformed increases.

In the folded state as shown in FIG. 11B, the cushion layer 530 may be partially deformed, and may thus extend up to a portion more adjacent to a deformable area of the display panel 510. The reinforcing plate 550 is made of a rigid material and is difficult to deform, and may thus be disposed to be spaced apart from the deformable area of the display panel 510.

An electronic device (e.g., the electronic device 200 in FIG. 1A) according to various example embodiments disclosed herein may include: a first housing (e.g., the first housing 210 in FIG. 1A), a second housing (e.g., the second housing 220 in FIG. 1A) rotatably connected to the first housing, a display panel (e.g., the display panel 430 in FIG. 4 and the display panel 510 in FIG. 5) in which a partial area is configured to be deformed by rotation of the second housing with respect to the first housing, a support plate (e.g., the support plate 450 in FIG. 4 and the support plate 520 in FIG. 5) disposed on the rear surface of the display panel supporting the display panel, the support plate including a first area (e.g., the first area 520A in FIG. 5), corresponding to the deformable area of the display panel and including multiple openings (e.g., the openings 4531 in FIG. 4 and the openings 521 in FIG. 5) formed at specified intervals, and a second area (e.g., the second area 520B in FIG. 5) excluding the first area, a cushion layer (e.g., the cushion layer 530 in FIG. 5) disposed on the rear surface of the support plate at a position corresponding to the second area and including a material capable of absorbing external impact, a foreign material blocking member comprising a flexible material (e.g., the foreign material blocking member 540 in FIG. 5) disposed on the rear surface of the support plate at a position corresponding to the first area and including a flexible material configured to be elongated according to the deformation of the display panel, and a reinforcing plate (e.g., the reinforcing plates 461 and 462 in FIG. 4, and the reinforcing plate 550 in FIG. 5) disposed under the cushion layer and the foreign material blocking member.

Furthermore, the cushion layer may include a first cushion layer (e.g., the first cushion layer 531 in FIG. 5) disposed in the first housing and a second cushion layer (e.g., the second cushion layer 532 in FIG. 5) separated from the first cushion layer and disposed in the second housing.

Furthermore, the cushion layer and the foreign material blocking member may be formed of different materials.

Furthermore, a thickness of the cushion layer may be greater than a thickness of the foreign material blocking member.

Furthermore, a length of the cushion layer in a first direction may be greater than a length of the reinforcing plate in the first direction.

Furthermore, the electronic device may further include a digitizer panel (e.g., the digitizer panel 470 in FIG. 4 and the digitizer panel 560 in FIG. 8) disposed on a rear surface of the cushion layer, wherein the reinforcing plate may be disposed on a rear surface of the digitizer panel to support the digitizer panel.

Furthermore, the electronic device may further include a first reinforcing member comprising a reinforcing material (e.g., the first reinforcing member 610 in FIG. 9) disposed between the foreign material blocking member and the digitizer panel, and including a material having higher rigidity than the foreign material blocking member.

Furthermore, the electronic device may further include a second reinforcing member (e.g., the second reinforcing member 620 in FIG. 10) comprising a reinforcing material disposed between the display panel and the digitizer panel at a position corresponding to an outer peripheral area in the first area of the support plate and including a material having higher rigidity than the cushion layer, and a waterproof member (e.g., the waterproof member 570 in FIG. 10) disposed on the rear surface of the reinforcing plate.

Furthermore, the reinforcing plate may be disposed on the rear surface of the cushion layer.

Furthermore, the electronic device may further include a first reinforcing member (e.g., the first reinforcing member 610 in FIG. 6B) comprising a reinforcing material disposed between the foreign material blocking member and the reinforcing plate, and including a material having higher rigidity than the foreign material blocking member.

Furthermore, the electronic device may further include a second reinforcing member (e.g., the second reinforcing member 620 in FIG. 7B) comprising a reinforcing material disposed between the display panel and the reinforcing plate at a position corresponding to an outer peripheral area in the first area of the support plate and including a material having higher rigidity than the cushion layer, and a waterproof member (e.g., the waterproof member 570 in FIG. 7B) disposed on the rear surface of the reinforcing plate.

A display module (e.g., the display module 230 in FIG. 4 and the display module 500 in FIG. 5) according to various example embodiments disclosed herein may include: a display panel (e.g., the display panel 430 in FIG. 4 and the display panel 510 in FIG. 5) in which a partial area is configured to be deformable, a support plate (e.g., the support plate 450 in FIG. 4 and the support plate 520 in FIG. 5) disposed on the rear surface of the display panel supporting the display panel, the support plate including a first area (e.g., the first area 520A in FIG. 5), corresponding to the deformable area of the display panel and including multiple openings (e.g., the openings 4531 in FIG. 4 and the openings 521 in FIG. 5) formed at specified intervals, and a second area (e.g., the second area 520B in FIG. 5) excluding the first area, a cushion layer (e.g., the cushion layer 530 in FIG. 5) disposed on the rear surface of the support plate at a position corresponding to the second area and including a material capable of absorbing external impact, a foreign material blocking member comprising a flexible material (e.g., the foreign material blocking member 540 in FIG. 5) disposed on the rear surface of the support plate at a position corresponding to the first area and including a flexible material configured to be elongated according to the deformation of the display panel, and a reinforcing plate (e.g., the reinforcing plates 461 and 462 in FIG. 4, and the reinforcing plate 550 in FIG. 5) disposed under the cushion layer and the foreign material blocking member.

Furthermore, the cushion layer and the foreign material blocking member may be formed of different materials.

Furthermore, a thickness of the cushion layer may be greater than a thickness of the foreign material blocking member.

Furthermore, a length of the cushion layer in a first direction may be greater than a length of the reinforcing plate in the first direction.

Furthermore, the display module may further include a digitizer panel (e.g., the digitizer panel 470 in FIG. 4 and the digitizer panel 560 in FIG. 8) disposed on the rear surface of the cushion layer, wherein the reinforcing plate is disposed on a rear surface of the digitizer panel to support the digitizer panel.

Furthermore, the display module may further include a first reinforcing member (e.g., the first reinforcing member 610 in FIG. 9) comprising a reinforcing material disposed between the foreign material blocking member and the digitizer panel, and including a material having higher rigidity than the foreign material blocking member.

Furthermore, the display module may further include a second reinforcing member (e.g., the second reinforcing member 620 in FIG. 10) comprising a reinforcing material disposed between the display panel and the digitizer panel at a position corresponding to an outer peripheral area in the first area of the support plate and including a material having higher rigidity than the cushion layer, and a waterproof member (e.g., the waterproof member 570 in FIG. 10) disposed on the rear surface of the reinforcing plate.

Furthermore, the display module may further include a first reinforcing member (e.g., the first reinforcing member 610 in FIG. 6B) comprising a reinforcing material disposed between the foreign material blocking member and the reinforcing plate, and including a material having higher rigidity than the foreign material blocking member.

Furthermore, the display module may further include a second reinforcing member (e.g., the second reinforcing member 620 in FIG. 7B) comprising a reinforcing material disposed between the display panel and the reinforcing plate at a position corresponding to an outer peripheral area in the first area of the support plate and including a material having higher rigidity than the cushion layer, and a waterproof member (e.g., the waterproof member 570 in FIG. 7B) disposed on the rear surface of the reinforcing plate.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. A display module comprising:
   a display panel, a partial area of which is configured to be deformable;
   a support plate disposed on a rear surface of the display panel supporting the display panel, the support plate comprising a first area, corresponding to the deformable area of the display panel and comprising multiple openings formed at specified intervals, and a second area excluding the first area;

a reinforcing plate disposed below the support plate;
a cushion layer disposed on a rear surface of the support plate at a position corresponding to the second area and directly above a top surface of the reinforcing plate, and comprising a material capable of absorbing external impact; and
a foreign material blocking member comprising a flexible material disposed on the rear surface of the support plate at a position corresponding to the first area and above a top surface of the reinforcing plate, and comprising a flexible material configured to be elongated according to deformation of the display panel.

2. The display module of claim 1, wherein the cushion layer and the foreign material blocking member are formed of different materials.

3. The display module of claim 1, wherein a thickness of the cushion layer is greater than a thickness of the foreign material blocking member.

4. The display module of claim 1, wherein a length of the cushion layer in a first direction is greater than a length of the reinforcing plate in the first direction.

5. The display module of claim 1, further comprising a digitizer panel disposed on a rear surface of the cushion layer,
wherein the reinforcing plate is disposed on a rear surface of the digitizer panel to support the digitizer panel.

6. The display module of claim 5, further comprising a first reinforcing member comprising a reinforcing material disposed between the foreign material blocking member and the digitizer panel, and comprising a material having higher rigidity than the foreign material blocking member.

7. The display module of claim 5, further comprising:
a second reinforcing member comprising a reinforcing material disposed between the display panel and the digitizer panel at a position corresponding to an outer peripheral area in the first area of the support plate, and comprising a material having higher rigidity than the cushion layer; and
a waterproof member comprising a waterproof material disposed on a rear surface of the reinforcing plate.

8. The display module of claim 1, further comprising a first reinforcing member comprising a reinforcing material disposed between the foreign material blocking member and the reinforcing plate, and comprising a material having higher rigidity than the foreign material blocking member.

9. The display module of claim 8, further comprising:
a second reinforcing member comprising a reinforcing material disposed between the display panel and the reinforcing plate at a position corresponding to an outer peripheral area in the first area of the support plate, and comprising a material having higher rigidity than the cushion layer; and
a waterproof member comprising a waterproof material disposed on a rear surface of the reinforcing plate.

10. An electronic device comprising:
a first housing;
a second housing rotatably connected to the first housing;
a display panel, a partial area of which is configured to be deformed by rotation of the second housing with respect to the first housing;
a support plate disposed on a rear surface of the display panel supporting the display panel, the support plate comprising a first area, corresponding to the deformable area of the display panel and comprising multiple openings formed at specified intervals, and a second area excluding the first area;
a reinforcing plate disposed below the support plate;
a cushion layer disposed on a rear surface of the support plate at a position corresponding to the second area and directly above a top surface of the reinforcing plate, and comprising a material capable of absorbing external impact; and
a foreign material blocking member comprising a flexible material disposed on the rear surface of the support plate at a position corresponding to the first area and above a top surface of the reinforcing plate, and comprising a flexible material configured to be elongated according to deformation of the display panel.

11. The electronic device of claim 10, wherein the cushion layer comprises a first cushion layer disposed in the first housing and a second cushion layer separated from the first cushion layer and disposed in the second housing.

12. The electronic device of claim 10, wherein the cushion layer and the foreign material blocking member are formed of different materials.

13. The electronic device of claim 10, wherein a thickness of the cushion layer is greater than a thickness of the foreign material blocking member.

14. The electronic device of claim 10, wherein a length of the cushion layer in a first direction is greater than a length of the reinforcing plate in the first direction.

15. The electronic device of claim 10, further comprising a digitizer panel disposed on a rear surface of the cushion layer,
wherein the reinforcing plate is disposed on a rear surface of the digitizer panel supporting the digitizer panel.

16. The electronic device of claim 15, further comprising a first reinforcing member comprising a reinforcing material disposed between the foreign material blocking member and the digitizer panel, and comprising a material having higher rigidity than the foreign material blocking member.

17. The electronic device of claim 15, further comprising:
a second reinforcing member comprising a reinforcing material disposed between the display panel and the digitizer panel at a position corresponding to an outer peripheral area in the first area of the support plate, and comprising a material having higher rigidity than the cushion layer; and
a waterproof member comprising a waterproof material disposed on a rear surface of the reinforcing plate.

18. The electronic device of claim 10, wherein the reinforcing plate is disposed on the rear surface of the cushion layer.

19. The electronic device of claim 18, further comprising a first reinforcing member comprising a reinforcing material disposed between the foreign material blocking member and the reinforcing plate, and comprising a material having higher rigidity than the foreign material blocking member.

20. The electronic device of claim 18, further comprising:
a second reinforcing member comprising a reinforcing material disposed between the display panel and the reinforcing plate at a position corresponding to an outer peripheral area in the first area of the support plate, and comprising a material having higher rigidity than the cushion layer; and
a waterproof member comprising a waterproof material disposed on a rear surface of the reinforcing plate.

* * * * *